（12) United States Patent
Maeda et al.

(10) Patent No.: US 6,905,912 B2
(45) Date of Patent: Jun. 14, 2005

(54) SEMICONDUCTOR DEVICE AND METHOD FOR FABRICATING THE SAME

(75) Inventors: Kenji Maeda, Osaka (JP); Takashi Takata, Shiga (JP); Takao Ochi, Shiga (JP); Hiroki Naraoka, Osaka (JP); Takeshi Kawabata, Shiga (JP); Yoshiyuki Arai, Kyoto (JP); Shigeru Nonoyama, Osaka (JP); Hajime Homma, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/407,185

(22) Filed: Apr. 7, 2003

(65) Prior Publication Data

US 2003/0207492 A1 Nov. 6, 2003

Related U.S. Application Data

(62) Division of application No. 09/886,997, filed on Jun. 25, 2001, now Pat. No. 6,582,991.

(30) Foreign Application Priority Data

Dec. 14, 2000 (JP) ........................................ 2000-380645

(51) Int. Cl.[7] ........................... H01L 21/44; H01L 21/50
(52) U.S. Cl. ..................... 438/108; 438/109; 438/110; 438/459
(58) Field of Search ................................ 438/107, 108, 438/109, 110, 459, 778

(56) References Cited

U.S. PATENT DOCUMENTS

| 4,869,954 A | | 9/1989 | Squitieri | |
|---|---|---|---|---|
| 5,166,099 A | | 11/1992 | Ueda et al. | |
| 5,801,072 A | * | 9/1998 | Barber | 438/107 |
| 5,899,792 A | | 5/1999 | Yagi | |
| 6,110,806 A | | 8/2000 | Pogge | |
| 6,133,637 A | * | 10/2000 | Hikita et al. | 257/777 |
| 6,316,276 B1 | | 11/2001 | Gregory et al. | |
| 6,376,917 B1 | * | 4/2002 | Takeshita et al. | 257/778 |
| 6,459,152 B1 | * | 10/2002 | Tomita et al. | 257/738 |
| 2001/0026010 A1 | | 10/2001 | Horiuchi et al. | |
| 2002/0006770 A1 | | 1/2002 | Bachand et al. | |

FOREIGN PATENT DOCUMENTS

| JP | 02-031437 | | 2/1990 |
|---|---|---|---|
| JP | 04-373157 | A | 12/1992 |
| JP | 08-023156 | A | 1/1996 |
| JP | 11-186301 | A | 7/1999 |
| JP | 2001-057404 | A | 2/2001 |
| JP | 2001-085453 | A | 3/2001 |

OTHER PUBLICATIONS

Notice of Reasons for Rejection for Patent Application No. 2000–380645, Mailing No. 260676, Mailing Date: Aug. 6, 2002.

* cited by examiner

*Primary Examiner*—Amir Zarabian
*Assistant Examiner*—Pamela E Perkins
(74) *Attorney, Agent, or Firm*—Nixon Peabody LLP; Donald R. Studebaker

(57) ABSTRACT

A semiconductor chip is mounted on a first surface of a substrate, the substrate having wiring formed on the first surface, so that a circuit formation surface of the semiconductor chip faces the first surface of the substrate and that electrodes provided on the circuit formation surface are connected with the wiring. A sealing resin layer is then formed on the first surface of the substrate to cover the semiconductor chip. The sealing resin layer and the semiconductor chip are ground starting from a surface opposite to the circuit formation surface to thin the semiconductor chip.

2 Claims, 30 Drawing Sheets

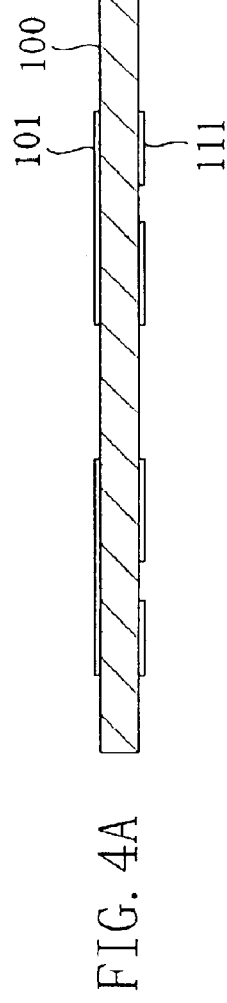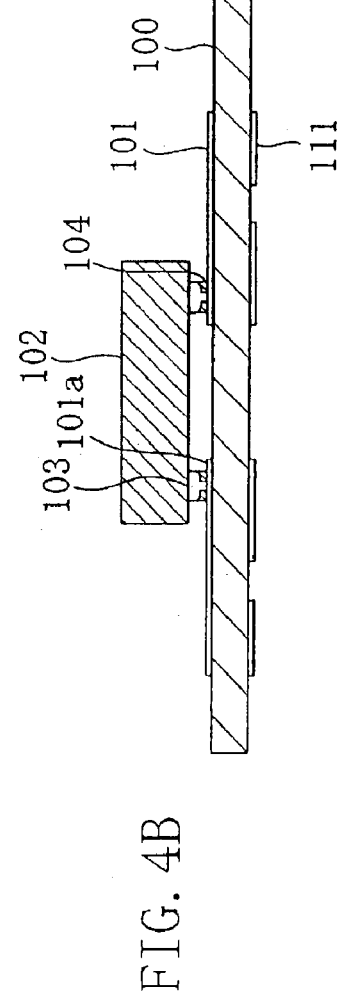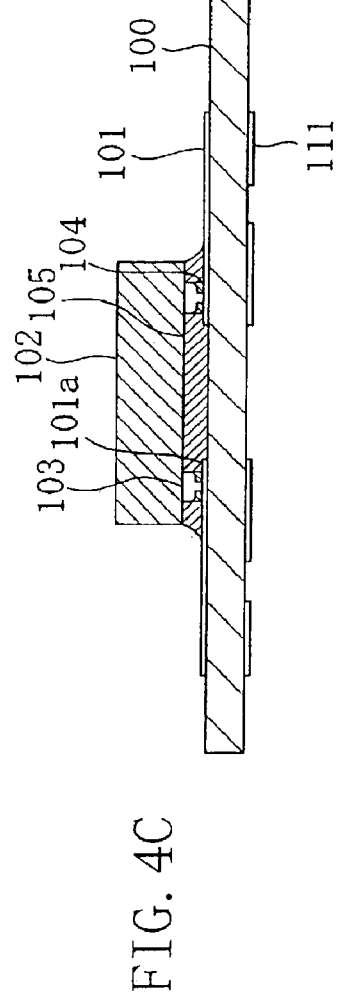

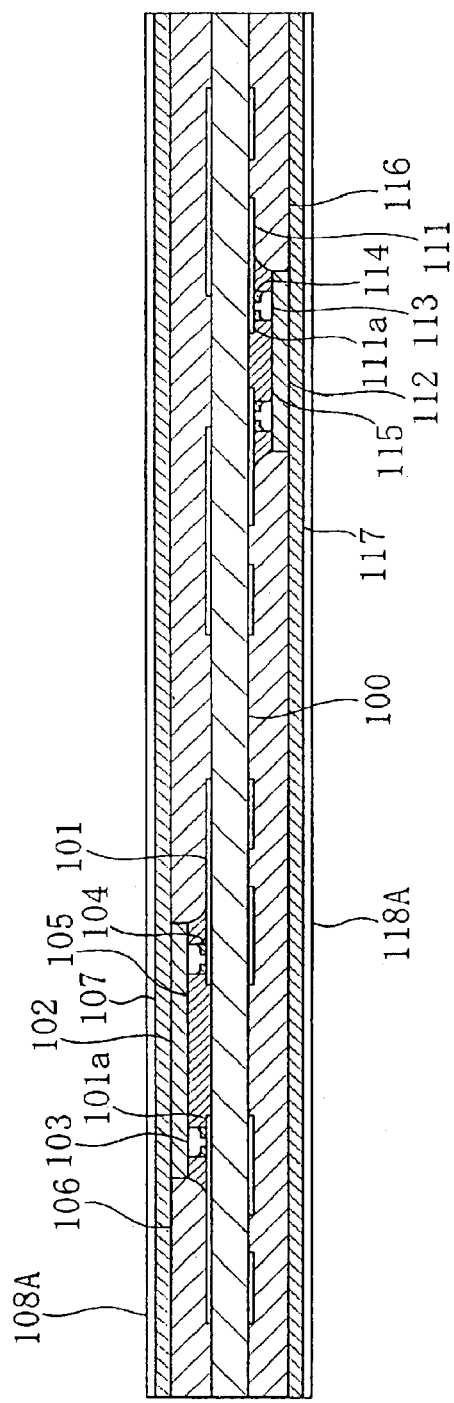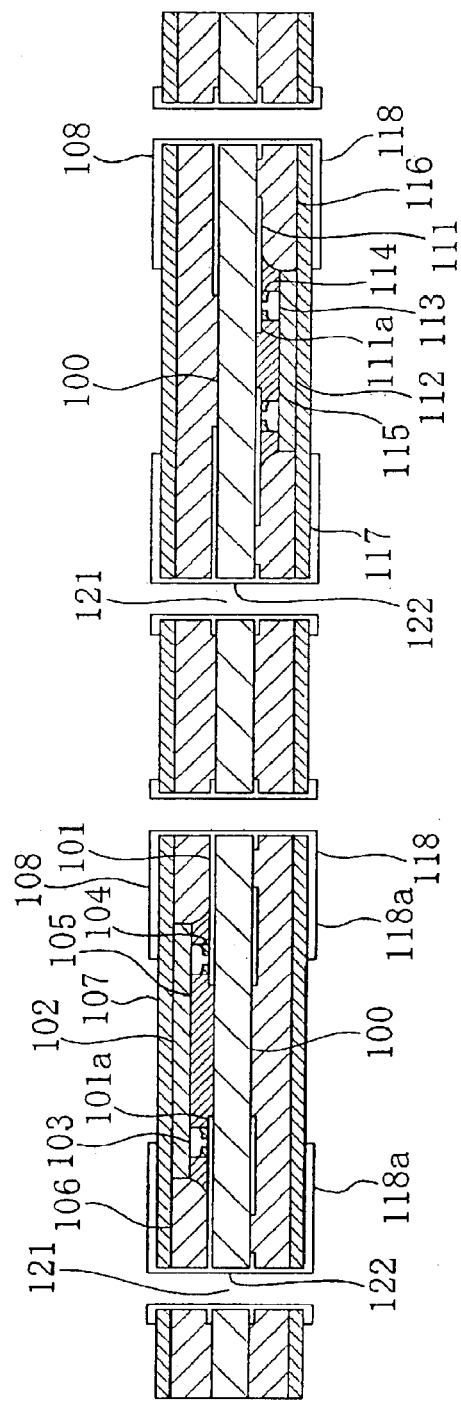
FIG. 6A
FIG. 6B

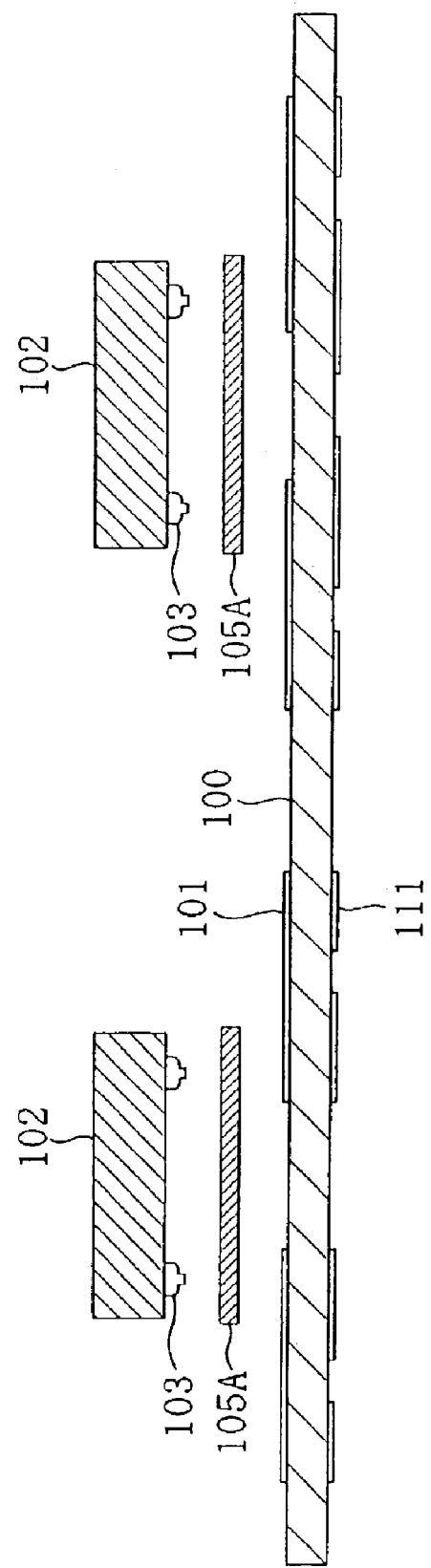

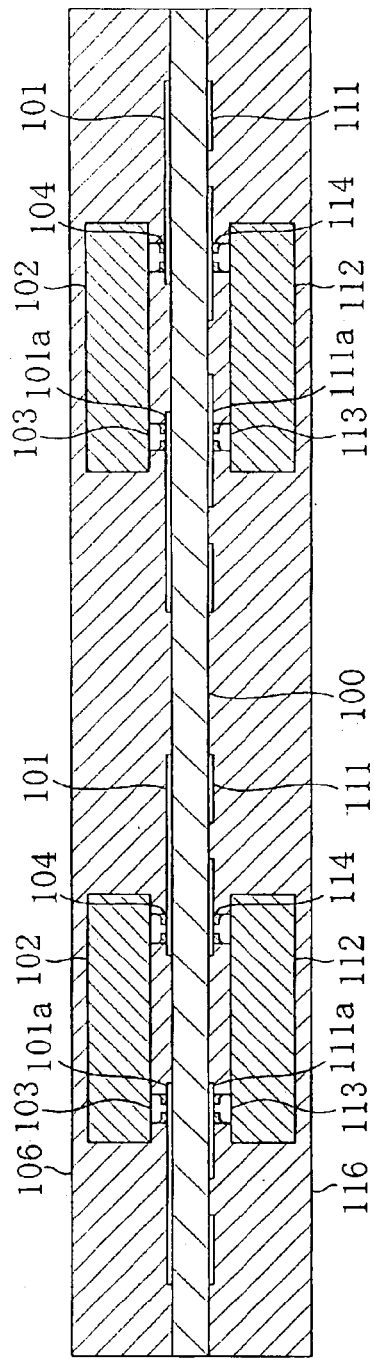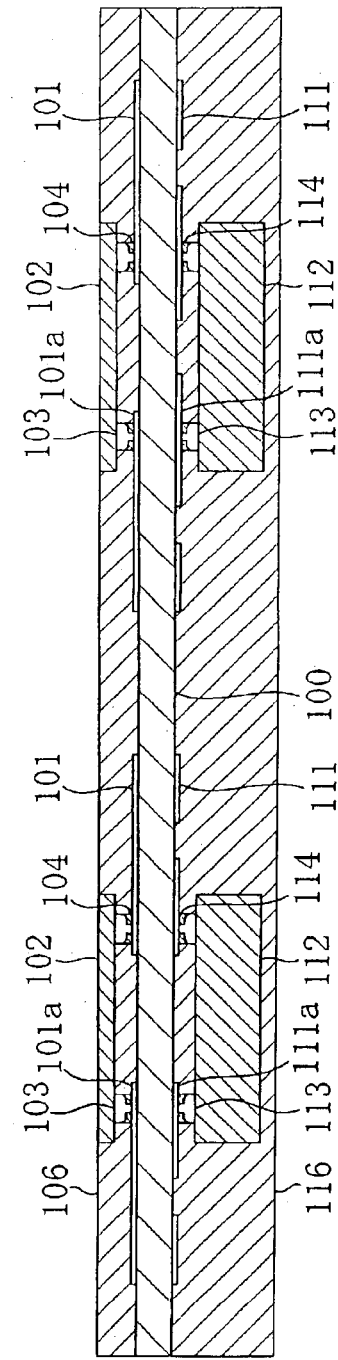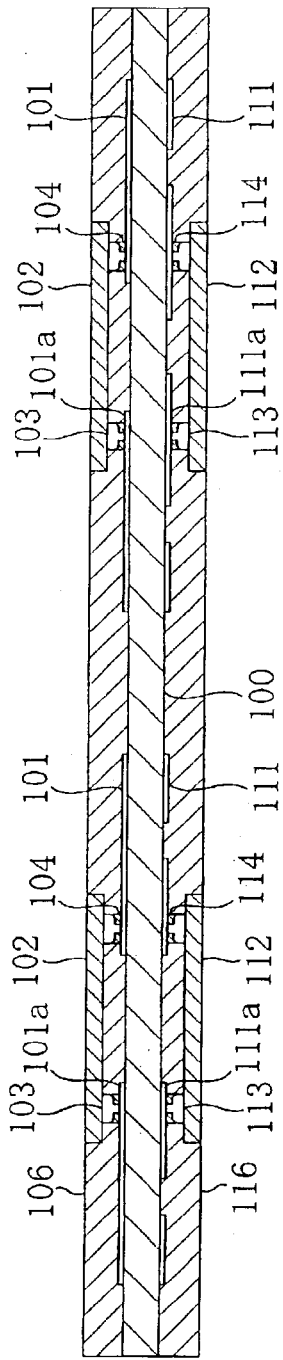

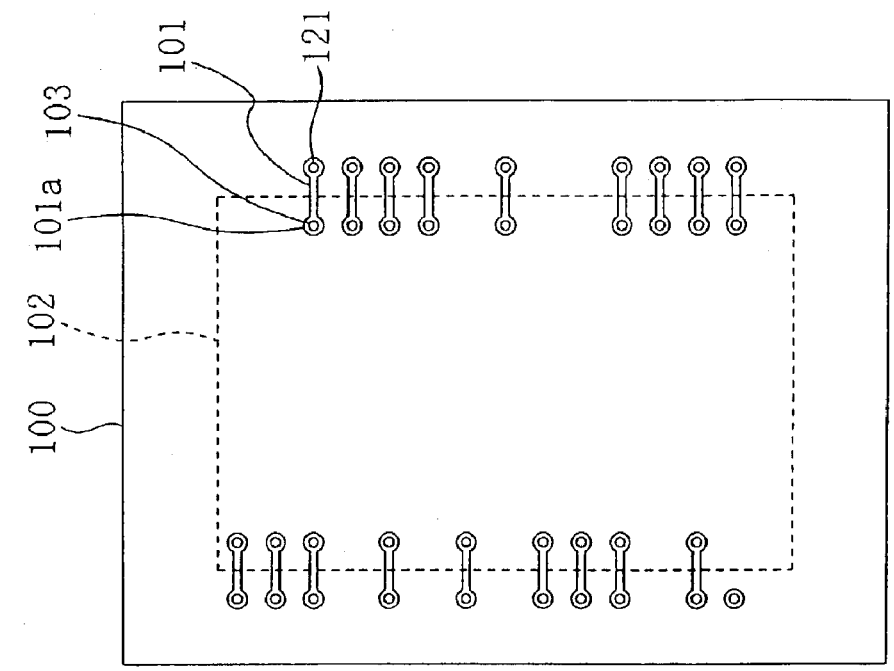
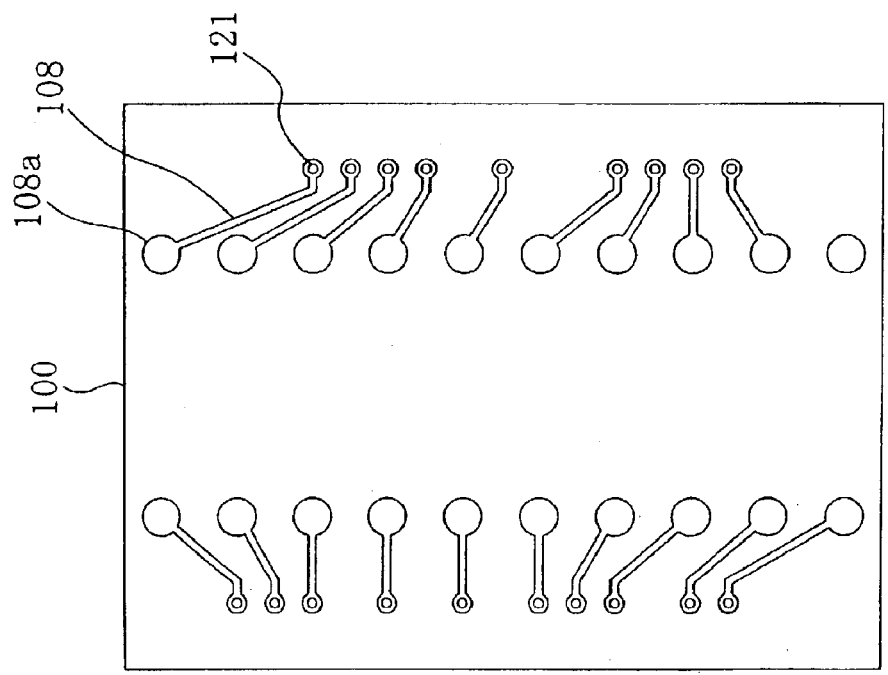

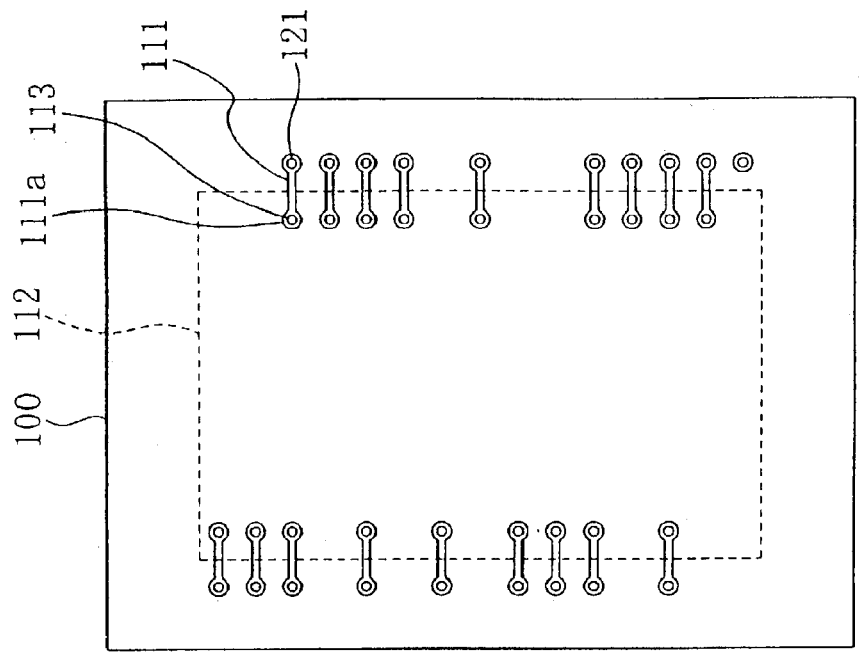
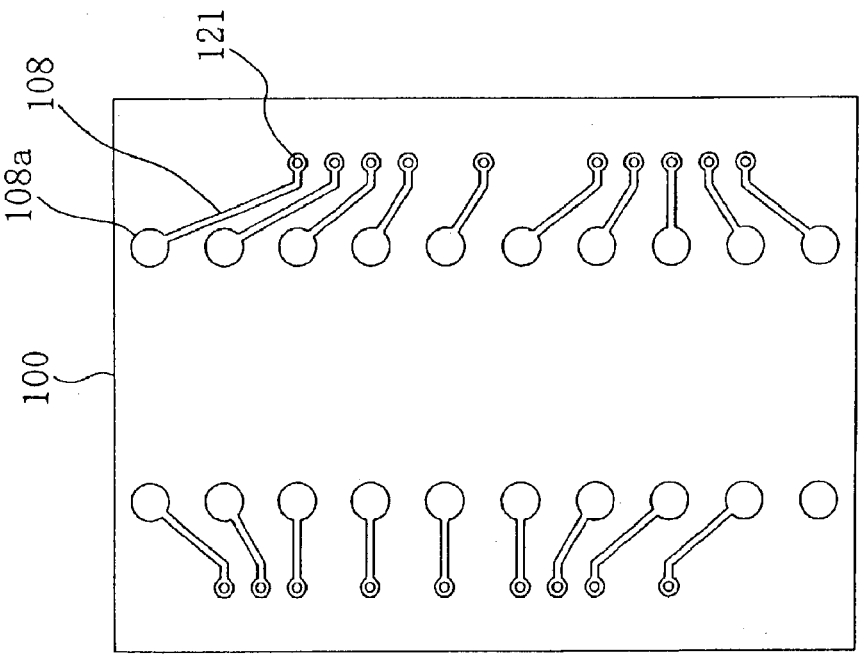

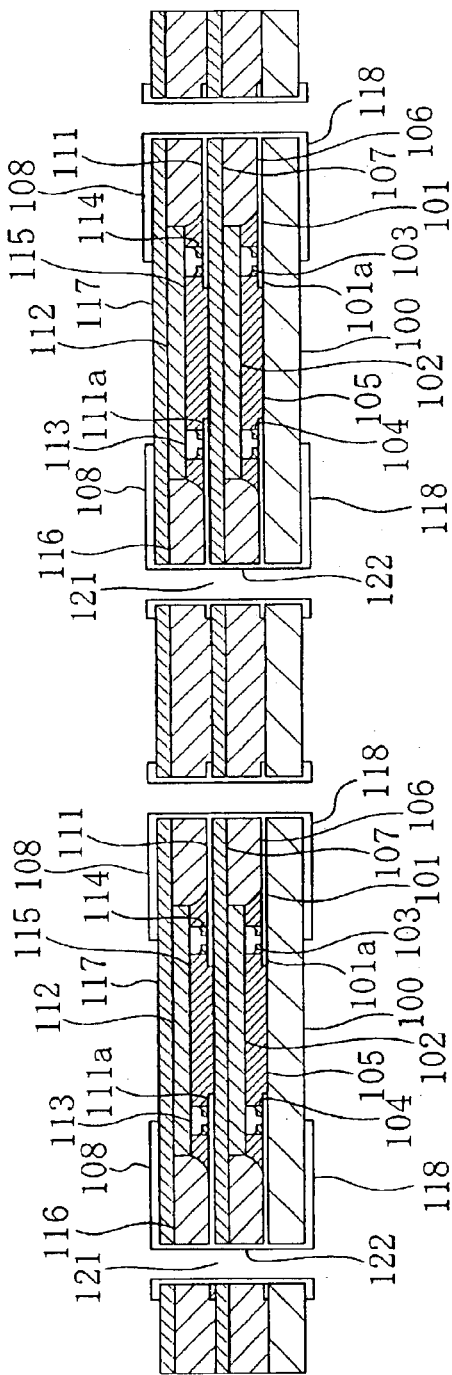
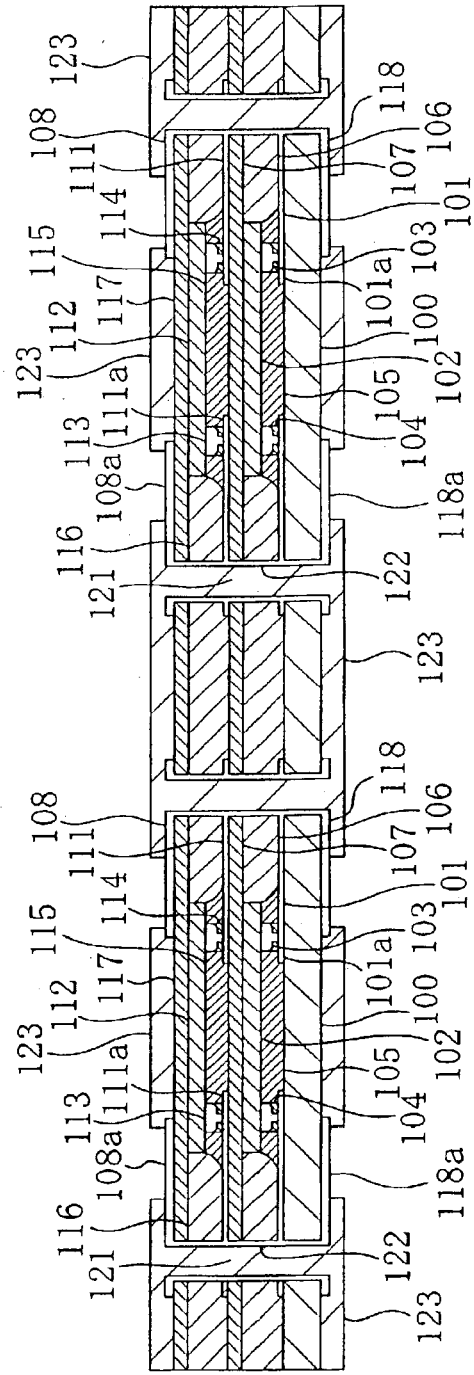
FIG. 29A
FIG. 29B

SEMICONDUCTOR DEVICE AND METHOD FOR FABRICATING THE SAME

BACKGROUND OF THE INVENTION

The present invention relates to a semiconductor device including semiconductor chips packaged therein, and more particularly to a semiconductor device including semiconductor chips packaged therein with high density where the semiconductor chips are buried in a printed wiring board, and a method for fabricating such a semiconductor device.

In recent years, electronic equipment, in particular portable electronic equipment, has been downsized at rapid paces. To keep pace with this, downsizing of semiconductor devices is also in progress. For example, small-size semiconductor packages such as chip scale packages (CSP) have been commercialized. Also commercialized have been semiconductor packages in which semiconductor chips are stacked on top of each other to reduce the packaging area of the semiconductor chips. Moreover, for attainment of further thinned electronic equipment, there have been developed semiconductor devices including semiconductor chips packaged therein with high density where the semiconductor chips are buried in a multilayer wiring board.

Hereinafter, as a conventional example, a semiconductor device and a fabrication method thereof disclosed in Japanese Laid-Open Patent Publication No. 4-373157 will be described with reference to FIGS. 30A through 30C.

FIGS. 30A through 30C are cross-sectional views illustrating process steps of a conventional method for fabricating a semiconductor device.

As shown in FIG. 30A, an insulating board 13 having an opening 13a is bonded to the top surface of a first circuit board 10. The first circuit board 10 has first and second wirings 11 and 12 formed on the top and bottom surfaces thereof. A semiconductor chip 14 is mounted on the exposed top surface of the first circuit board 10 inside the opening 13a so that the circuit formation surface of the semiconductor chip 14 faces the top surface of the first circuit board 10, that is, by face-down bonding. To state more specifically, bumps 15, which are formed on electrodes (not shown) provided on the circuit formation surface of the semiconductor chip 14, are bonded to the first wiring 11 with conductive paste 16. A first resin layer 17 is then formed between the semiconductor chip 14 and the first circuit board 10.

As shown in FIG. 30B, a second resin layer 18 is formed on the sides and the top surface of the semiconductor chip 14 so that the opening 13a is filled completely. Thereafter, as shown in FIG. 30C, a second circuit board 20 is bonded to the top surfaces of the insulating board 13 and the second resin layer 18. The second circuit board 20 has third and fourth wirings 21 and 22 formed on the top and bottom surfaces thereof.

By the fabrication through the process steps shown in FIGS. 30A through 30C, completed is a semiconductor device where the semiconductor chip 14 is buried inside the multilayer circuit board composed of the first circuit board 10, the insulating board 13, the second circuit board 20, and the like.

The conventional semiconductor device described above has the following problems. The opening 13a must be formed through the insulating board 13 constituting the multilayer circuit board, to mount the semiconductor chip therein. This increases the number of fabrication steps and thus increases the cost. In addition, the first wiring 11 may be contaminated with an adhesive material and the like flowing out during the bonding of the insulating board 13 to the first circuit board 10. This makes it difficult to keep clean the connecting portions of the first wiring 11 with the semiconductor chip 14, and thus to ensure the electrical connection between the first wiring 11 and the semiconductor chip 14. Another problem is that separation is likely to occur at the interface between the insulating board 13 having the opening 13a and the second resin layer 18 filled in the opening 13a. This makes it difficult to attain a good-quality semiconductor device.

In order to reduce the thickness of the entire semiconductor device including semiconductor chips packaged therein, the semiconductor chips must be thin. A thin semiconductor chip is more susceptible to external damage and more easily warped losing flatness, compared with a thick semiconductor chip. Therefore, when a thin semiconductor chip is used for the conventional semiconductor device, difficulty arises during the formation of bumps and the mounting of the semiconductor chip in the board. In other words, in order to prevent a semiconductor chip from external damage and warping in the conventional semiconductor device, a thick semiconductor chip must be mounted. This increases the thickness of the multilayer circuit board constituting the conventional semiconductor device. In addition, since a thick semiconductor chip is buried with a resin in the multilayer circuit board, heat generated due to the operation of the semiconductor chip is less easily dissipated outside.

SUMMARY OF THE INVENTION

An object of the present invention is providing a thin semiconductor device with high reliability and high heat dissipation in which semiconductor chips are packaged with high density and, and a method for easily fabricating such a semiconductor device.

The first method for fabricating a semiconductor device of the present invention includes the steps of: (1) mounting a semiconductor chip on a first surface of a substrate, the substrate having wiring formed on the first surface, so that a circuit formation surface of the semiconductor chip faces the first surface of the substrate and that an electrode provided on the circuit formation surface is connected with the wiring; (2) forming a sealing resin layer on the first surface of the substrate to cover the semiconductor chip; and (3) grinding the sealing resin layer and the semiconductor chip starting from a surface opposite to the circuit formation surface to thin the semiconductor chip.

According to the first method for fabricating a semiconductor device, a semiconductor chip is first mounted on the first surface of the substrate so that the circuit formation surface of the semiconductor chip faces the first surface of the substrate, and then the semiconductor chip is ground starting from the surface thereof opposite to the circuit formation surface, to be thinned. Accordingly, it is possible to handle the original thick semiconductor chip during the mounting of the semiconductor chip on the substrate. Thus, formation of the bumps on the semiconductor chip, the mounting of the semiconductor chip on the substrate, and the like can be performed easily and reliably while preventing occurrence of external damage and warp. Moreover, since the semiconductor chip mounted on the substrate is thinned by grinding, heat generated due to the operation of the semiconductor chip is easily dissipated. In addition, when such semiconductor chips are layered in a semiconductor device, the thickness of the resultant semiconductor device can be small. As a result, it is possible to easily fabricate a thin semiconductor device with high reliability and high heat dissipation in which semiconductor chips are packaged with high density.

According to the first method for fabricating a semiconductor device, the semiconductor chip is ground while being surrounded and sealed with a resin. This suppresses occurrence of external damage on the semiconductor chip due to the grinding, and thus a semiconductor device can be fabricated without deterioration in quality.

According to the first method for fabricating a semiconductor device, the semiconductor chip is mounted on the substrate and then covered with the resin layer. This simplifies the fabrication process compared with the conventional technique where an opening is formed through the insulating layer on the substrate and the semiconductor chip is buried in the opening together with the resin. This also prevents occurrence of the prior art problem of separation at the interface between the insulating layer having the opening and the resin layer filled in the opening, and thus a high-quality semiconductor device is attained.

In the first method for fabricating s semiconductor device, a filler made of an inorganic material is preferably mixed in the sealing resin layer.

The filler-mixed sealing resin layer has hardness closer to the hardness of the semiconductor chip, and this enables the sealing resin layer and the semiconductor chip to be ground simultaneously and uniformly. Thus, a high-quality semiconductor device is attained. Moreover, the filler serves to reduce the thermal expansion coefficient and curing shrinkage coefficient of the sealing resin layers. Therefore, the stress of the sealing resin layer acting on the semiconductor chip reduces, and thus warp of the semiconductor chip is made small. This enables fabrication of a higher-quality semiconductor device.

The first method for fabricating a semiconductor device preferably further includes the step of forming a resin layer between the substrate and the semiconductor chip between the step (1) and the step (2).

The above method prevents formation of a void-contained resin layer between the semiconductor chip and the substrate in the step (2) of forming the sealing resin layer covering the semiconductor chip. This improves the reliability of the semiconductor device.

In the first method for fabricating a semiconductor device, the step (2) preferably includes the step of forming the sealing resin layer under a pressure lower than the atmospheric pressure.

The above method suppresses generation of a void in the sealing resin layer covering the semiconductor chip, and thus improves the reliability of the semiconductor device.

In the method for fabricating a semiconductor device, the step (3) preferably includes the step of grinding the semiconductor chip and the sealing resin layer so as to be flush with each other.

The above method facilitates mounting of a new semiconductor chip or formation of a new insulating layer or wiring layer on the surface of the semiconductor chip or the sealing resin layer opposite to the circuit formation surface at a later stage.

In the first method for fabricating a semiconductor device, the step (3) preferably includes the step of recognizing a start position of grinding of the semiconductor chip by detecting a change in electrical resistance of grinding water containing chippings generated by the grinding of the semiconductor chip and the sealing resin layer.

By the above method, the variation in the thickness of the ground semiconductor chip can be reduced. Therefore, a small target value can be set for the thickness of the ground semiconductor chip, and thus the thickness of the ground semiconductor chip can be further reduced.

In the method for fabricating a semiconductor device, the step (3) preferably includes the step of recognizing a start position of grinding of the semiconductor chip by detecting a change in grinding drag acting on a grinder for grinding the semiconductor chip and the sealing resin layer.

By the above method, the variation in the thickness of the ground semiconductor chip can be reduced. Therefore, a small target value can be set for the thickness of the ground semiconductor chip, and thus the thickness of the ground semiconductor chip can be further reduced.

In the method for fabricating a semiconductor device, the step (3) preferably includes the step of recognizing a start position of grinding of the semiconductor chip by irradiating the semiconductor chip and the sealing resin layer with light and detecting a change in reflection amount or absorption amount of the light.

By the above method, the variation in the thickness of the ground semiconductor chip can be reduced. Therefore, a small target value can be set for the thickness of the ground semiconductor chip, and thus the thickness of the ground semiconductor chip can be further reduced.

The method for fabricating a semiconductor device preferably further includes the step of forming an insulating layer on a surface opposite to the circuit formation surface of the semiconductor chip after the step (3).

The above method protects the semiconductor chip against external damage, and electrically protects the semiconductor chip by insulating the semiconductor chip from a wiring layer that may be newly formed on the surface of the semiconductor chip opposite to the circuit formation surface at a later stage. The above method therefore simplifies handling of the semiconductor device including a thin semiconductor chip packaged therein.

When an insulating layer is formed on a surface opposite to the circuit formation surface of the semiconductor chip, the insulating layer is preferably made of a material different from a material of the sealing resin layer.

By using a different material, the insulating layer and the sealing resin layer can be different from each other in characteristics such as resin flow filling ability, thickness uniformity, adhesion, mechanical strength, and the like. This enables easy fabrication of a high-quality semiconductor device.

When an insulating layer is formed on a surface opposite to the circuit formation surface of the semiconductor chip, the insulating layer is preferably formed by curing a resin in resin-added copper foil.

By using resin-added copper foil, when wiring is formed on the surface of the semiconductor chip opposite to the circuit formation surface, a conductive film to be patterned into the wiring can be formed simultaneously with the formation of the insulating layer that electrically protects the semiconductor chip. This simplifies the fabrication process and thus enables efficient fabrication of the semiconductor device.

The first method for fabricating a semiconductor device preferably further includes the step of forming a conductive layer on a surface opposite to the circuit formation surface of the semiconductor chip after the step (3).

By the above method, if a metal material or the like is used as the conductive layer, the thermal conductivity of the conductive layer can be increased, and thus heat generating during the operation of the semiconductor chip can be efficiently dissipated outside. In addition, it becomes easy to secure the substrate potential at the semiconductor chip via the conductive layer.

The first method for fabricating a semiconductor device preferably further includes the step of forming an external connection terminal on a surface of the sealing resin layer or the semiconductor chip opposite to the circuit formation surface, or on a second surface of the substrate, after the step (3).

By the above method, it is possible to electrically and mechanically connect another electrical component to the external connection terminal. In this way, a good-quality, large-scale, multi-function electric circuit system can be efficiently attained.

The method for fabricating a semiconductor device preferably further includes the step of forming a first external connection terminal on a surface of the sealing resin layer or the semiconductor chip opposite to the circuit formation surface, and a second external connection terminal on a second surface of the substrate, after the step (3), wherein the first external connection terminal and the second external connection terminal are located in the same region when viewed from a position above the first surface of the substrate.

By the above method, it is possible to electrically and mechanically connect a plurality of semiconductor devices fabricated by the first method for fabricating a semiconductor device by stacking them on top of each other. In this way, a good-quality, large-scale, electric circuit system can be efficiently attained.

The second method for fabricating a semiconductor device of the present invention includes the steps of: (1) mounting a first semiconductor chip on a first surface of a substrate, the substrate having first wiring formed on the first surface, so that a first circuit formation surface of the first semiconductor chip faces the first surface of the substrate and that a first electrode provided on the first circuit formation surface is connected with the first wiring; (2) forming a first sealing resin layer on the first surface of the substrate to cover the first semiconductor chip; (3) grinding the first sealing resin layer and the first semiconductor chip starting from a surface opposite to the first circuit formation surface to thin the first semiconductor chip; (4) forming second wiring on a surface of the first sealing resin layer or the first semiconductor chip opposite to the first circuit formation surface; (5) mounting a second semiconductor chip on the surface of the first sealing resin layer or the first semiconductor chip opposite to the first circuit formation surface so that a second circuit formation surface of the second semiconductor chip faces the first surface of the substrate and that a second electrode provided on the second circuit formation surface is connected with the second wiring; (6) forming a second sealing resin layer on the surface of the first sealing resin layer or the first semiconductor chip opposite to the first circuit formation surface to cover the second semiconductor chip; and (7) grinding the second sealing resin layer and the second semiconductor chip starting from a surface opposite to the second circuit formation surface to thin the second semiconductor chip.

The second method for fabricating a semiconductor device can provide the effect that the semiconductor device including layered semiconductor chips can be thinned without fail, in addition to the effects obtained in the first method for fabricating a semiconductor device.

In the second method for fabricating a semiconductor device, the first semiconductor chip and the second semiconductor chip are preferably the same in the number of terminals and the positions of the terminals.

By the above method, it is possible reduce the length of the wiring connecting the semiconductor chips, and thus the wiring pattern can be simplified.

The third method for fabricating a semiconductor device of the present invention includes the steps of: (1) mounting a first semiconductor chip on a first surface of a substrate, the substrate having first wiring formed on the first surface and second wiring formed on a second surface, so that a first circuit formation surface of the first semiconductor chip faces the first surface of the substrate and that a first electrode provided on the first circuit formation surface is connected with the first wiring; (2) forming a first sealing resin layer on the first surface of the substrate to cover the first semiconductor chip; (3) grinding the first sealing resin layer and the first semiconductor chip starting from a surface opposite to the first circuit formation surface to thin the first semiconductor chip; (4) mounting a second semiconductor chip on the second surface of the substrate so that a second circuit formation surface of the second semiconductor chip faces the second surface of the substrate and that a second electrode provided on the second circuit formation surface is connected with the second wiring; (5) forming a second sealing resin layer on the second surface of the substrate to cover the second semiconductor chip; and (6) grinding the second sealing resin layer and the second semiconductor chip starting from a surface opposite to the second circuit formation surface to thin the second semiconductor chip.

The third method for fabricating a semiconductor device can provide the effect that the semiconductor device including layered semiconductor chips can be thinned without fail, in addition to the effects obtained in the first method for fabricating a semiconductor device. In addition, the resin layers covering the semiconductor chips are formed symmetrically with respect to the substrate. This balances the shrinkage of the resin layers on both surfaces of the substrate and thus serves to minimize the amount of warp of the semiconductor devices.

In the second or third method for fabricating a semiconductor device, the first semiconductor chip and the second semiconductor chip are preferably located in the same region when viewed from a position above the first surface of the substrate.

By the above method, it is possible to reduce the plan dimensions of the semiconductor device including semiconductor chips packaged therein. Specifically, it is possible to attain a semiconductor device that has plan dimensions close to those of the semiconductor chips and realizes a packaging density as high as that of a CSP.

In the third method for fabricating a semiconductor device, the step (3) is preferably performed in the state where the second wiring has not been formed on the second surface of the substrate.

By the above method, it is possible to minimize the unevenness of the second surface of the substrate that is opposite to the surface to be ground of the substrate including the semiconductor chip. It is therefore possible to grind the surface to be ground uniformly and thus suppress generation of damage and the like in the semiconductor chip. As a result, a good-quality semiconductor device can be fabricated.

In the third method for fabricating a semiconductor device, the step (3) is preferably performed in the state where a conductive film is formed on the second surface of the substrate and has not yet been patterned into the second wiring.

By the above method, it is possible to minimize the unevenness of the second surface of the substrate that is opposite to the surface to be ground of the substrate including the semiconductor chip. It is therefore possible to grind the surface to be ground uniformly and thus suppress generation of damage and the like in the semiconductor chip. As a result, a good-quality semiconductor device can be fabricated.

The third method for fabricating a semiconductor device preferably further includes the step of covering the surface of the first semiconductor chip opposite to the first circuit formation surface and the surface of the second semiconductor chip opposite to the second circuit formation surface with a resin film simultaneously, after the step (6).

By the above method, the fabrication process can be simplified, and thus the semiconductor device can be efficiently fabricated.

The fourth method for fabricating a semiconductor device of the present invention includes the steps of: (1) mounting a plurality of semiconductor chips each for each of a plurality of regions on a first surface of a substrate, the substrate having a plurality of wirings each formed for each of the plurality of regions on the first surface, so that circuit formation surfaces of the respective semiconductor chips face the first surface of the substrate and that electrodes provided on the circuit formation surfaces are respectively connected with the plurality of wirings; (2) forming a sealing resin layer on the first surface of the substrate to cover the plurality of semiconductor chips; (3) grinding the sealing resin layer and the plurality of semiconductor chips starting from surfaces opposite to the circuit formation surfaces to thin the plurality of semiconductor chips; and (4) dividing the substrate including the plurality of thinned semiconductor chips into the plurality of regions.

The fourth method for fabricating a semiconductor device can provide the effect that a small semiconductor device having plan dimensions close to those of the semiconductor chips can be fabricated simply in large quantity, in addition to the effects obtained in the first method for fabricating a semiconductor device.

The fifth method for fabricating a semiconductor device of the present invention includes the steps of: (1) mounting a plurality of first semiconductor chips each for each of a plurality of regions on a first surface of a substrate, the substrate having a plurality of first wirings each formed for each of the plurality of regions on the first surface, so that first circuit formation surfaces of the respective first semiconductor chips face the first surface of the substrate and that electrodes provided on the first circuit formation surfaces are respectively connected with the plurality of first wirings; (2) forming a first sealing resin layer on the first surface of the substrate to cover the plurality of first semiconductor chips; (3) grinding the first sealing resin layer and the plurality of first semiconductor chips starting from surfaces opposite to the first circuit formation surfaces to thin the plurality of first semiconductor chips; (4) forming a plurality of second wirings each for each of the plurality of regions on a surface of the first sealing resin layer or the surfaces of the plurality of first semiconductor chips opposite to the first circuit formation surfaces; (5) mounting a plurality of second semiconductor chips each for each of the plurality of regions on the surface of the first sealing resin layer or the surfaces of the plurality of first semiconductor chips opposite to the first circuit formation surfaces so that second circuit formation surfaces of the respective second semiconductor chips face the first surface of the substrate and that second electrodes provided on the second circuit formation surfaces are respectively connected with the plurality of second wirings; (6) forming a second sealing resin layer on the surface of the first sealing resin layer or the surfaces of the plurality of first semiconductor chips opposite to the first circuit formation surfaces to cover the plurality of second semiconductor chips; (7) grinding the second sealing resin layer and the plurality of second semiconductor chips starting from surfaces opposite to the second circuit formation surfaces to thin the plurality of second semiconductor chips; and (8) dividing the substrate including the plurality of thinned second semiconductor chips into the plurality of regions.

The fifth method for fabricating a semiconductor device can provide the effect that a small semiconductor device having plan dimensions close to those of the semiconductor chips can be fabricated simply in large quantity, in addition to the effects obtained in the second method for fabricating a semiconductor device.

The sixth method for fabricating a semiconductor device of the present invention includes the steps of: (1) mounting a plurality of first semiconductor chips each for each of a plurality of regions on a first surface of a substrate, the substrate having a plurality of first wirings each formed for each of the plurality of regions on the first surface and a plurality of second wirings each formed for each of the plurality of regions on a second surface, so that first circuit formation surfaces of the respective first semiconductor chips face the first surface of the substrate and that electrodes provided on the first circuit formation surfaces are respectively connected with the plurality of first wirings; (2) forming a first sealing resin layer on the first surface of the substrate to cover the plurality of first semiconductor chips; (3) grinding the first sealing resin layer and the plurality of first semiconductor chips starting from surfaces opposite to the first circuit formation surfaces to thin the plurality of first semiconductor chips; (4) mounting a plurality of second semiconductor chips each for each of the plurality of regions on the second surface of the substrate so that second circuit formation surfaces of the respective second semiconductor chips face the second surface of the substrate and that second electrodes provided on the second circuit formation surfaces are respectively connected with the plurality of second wirings; (5) forming a second sealing resin layer on the second surface of the substrate to cover the plurality of second semiconductor chips; (6) grinding the second sealing resin layer and the plurality of second semiconductor chips starting from surfaces opposite to the second circuit formation surfaces to thin the plurality of second semiconductor chips; and (7) dividing the substrate including the plurality of thinned second semiconductor chips into the plurality of regions.

The sixth method for fabricating a semiconductor device can provide the effect that a small semiconductor device having plan dimensions close to those of the semiconductor chips can be fabricated simply in large quantity, in addition to the effects obtained in the third method for fabricating a semiconductor device.

The first semiconductor device of the present invention includes: a semiconductor chip mounted on a first surface of a substrate, the substrate having wiring formed on the first surface, so that a circuit formation surface of the semiconductor chip faces the first surface of the substrate and that an electrode provided on the circuit formation surface is connected with the wiring; and a sealing resin layer formed on the first surface of the substrate to cover the semiconductor chip and also be flush with a surface of the semiconductor chip opposite to the circuit formation surface.

The first semiconductor device is formed by the first or fourth fabrication method of the present invention, and therefore provides substantially the same effects as those provided by the first or fourth fabrication method.

The first semiconductor device preferably further includes an insulating layer formed on the surface of the semiconductor chip opposite to the circuit formation surface.

The above construction protects the semiconductor chip against external damage, and also electrically protects the semiconductor chip by insulating the semiconductor chip from a wiring layer that may be formed on the surface of the semiconductor chip opposite to the circuit formation surface at a later stage. This simplifies handling of the semiconductor device including a thin semiconductor chip packaged therein.

The first semiconductor device preferably further includes a conductive layer formed on the surface of the semiconductor chip opposite to the circuit formation surface.

With the above construction, if a metal material or the like is used as the conductive layer, the thermal conductivity of the conductive layer can be increased, and thus heat generating during the operation of the semiconductor chip can be efficiently dissipated outside. In addition, it becomes easy to secure the substrate potential at the semiconductor chip via the conductive layer.

The first semiconductor device preferably further includes an external connection terminal formed on a surface of the sealing resin layer or the semiconductor chip opposite to the circuit formation surface, or on a second surface of the substrate.

With the above construction, it is possible to electrically and mechanically connect another electrical component to the external connection terminal. In this way, a good-quality, large-scale, multi-function electric circuit system can be efficiently attained.

The first semiconductor device further includes a first external connection terminal formed on a surface of the sealing resin layer or the semiconductor chip opposite to the circuit formation surface; and a second external connection terminal formed on a second surface of the substrate, wherein the first external connection terminal and the second external connection terminal are located in the same region when viewed from a position above the first surface of the substrate.

With the above construction, it is possible to electrically and mechanically connect a plurality of first semiconductor devices by stacking them on top of each other. In this way, a good-quality, large-scale, electric circuit system can be efficiently attained.

The second semiconductor device of the present invention includes: a first semiconductor chip mounted on a first surface of a substrate, the substrate having first wiring formed on the first surface, so that a first circuit formation surface of the first semiconductor chip faces the first surface of the substrate and that a first electrode provided on the first circuit formation surface is connected with the first wiring; a first sealing resin layer formed on the first surface of the substrate to cover the first semiconductor chip and also be flush with a surface of the first semiconductor chip opposite to the first circuit formation surface; second wiring formed on a surface of the first sealing resin layer or the first semiconductor chip opposite to the first circuit formation surface; a second semiconductor chip mounted on the surface of the first sealing resin layer or the first semiconductor chip opposite to the first circuit formation surface so that a second circuit formation surface of the second semiconductor chip faces the first surface of the substrate and that a second electrode provided on the second circuit formation surface is connected with the second wiring; and a second sealing resin layer formed on the surface of the first sealing resin layer or the first semiconductor chip opposite to the first circuit formation surface to cover the second semiconductor chip and also be flush with a surface of the second semiconductor chip opposite to the second circuit formation surface.

The second semiconductor device is formed by the second or fifth fabrication method of the present invention, and therefore provides substantially the same effects as those provided by the second or fifth fabrication method.

In the second semiconductor device, the first semiconductor chip and the second semiconductor chip are preferably the same in the number of terminals and the positions of the terminals.

With the above construction, it is possible reduce the length of the wiring connecting the semiconductor chips, and thus the wiring pattern can be simplified.

The third semiconductor device of the present invention includes: a first semiconductor chip mounted on a first surface of a substrate, the substrate having first wiring formed on the first surface and second wiring formed on a second surface, so that a first circuit formation surface of the first semiconductor chip faces the first surface of the substrate and that a first electrode provided on the first circuit formation surface is connected with the first wiring; a first sealing resin layer formed on the first surface of the substrate to cover the first semiconductor chip and also be flush with a surface of the first semiconductor chip opposite to the first circuit formation surface; a second semiconductor chip mounted on the second surface of the substrate so that a second circuit formation surface of the second semiconductor chip faces the second surface of the substrate and that a second electrode provided on the second circuit formation surface is connected with the second wiring; and a second sealing resin layer formed on the second surface of the substrate to cover the second semiconductor chip and also be flush with a surface of the second semiconductor chip opposite to the second circuit formation surface.

The third semiconductor device is formed by the third or sixth fabrication method of the present invention, and therefore provides substantially the same effects as those provided by the third or sixth fabrication method.

In the second or third semiconductor device, the first semiconductor chip and the second semiconductor chip are preferably located in the same region when viewed from a position above the first surface of the substrate.

With the above construction, it is possible to reduce the plan dimensions of the semiconductor device including layered semiconductor chips packaged therein. Specifically, it is possible to realize a packaging density as high as that of a CSP that has plan dimensions close to those of the semiconductor chips.

BRIEF DESCRIPTION OF THE DRAWINGS

FIGS. 4A through 4C are cross-sectional views illustrating process steps of the method for fabricating the semiconductor device of EMBODIMENT 1.

FIGS. 6A and 6B are cross-sectional views illustrating further subsequent process steps of the method for fabricating the semiconductor device of EMBODIMENT 1.

FIG. 7 is a cross-sectional view illustrating a process step of a first modification of the method for fabricating the semiconductor device of EMBODIMENT 1 of the present invention.

FIGS. 11A through 11C are cross-sectional views illustrating process steps of a third modification of the method for fabricating the semiconductor device of EMBODIMENT 1 of the present invention.

FIGS. 21A and 21B are views schematically illustrating wiring patterns of a comparative example (semiconductor device of EMBODIMENT 3).

FIGS. 23A and 23B are views schematically illustrating wiring patterns of the semiconductor device of EMBODIMENT 4.

FIGS. 29A and 29B are cross-sectional views illustrating further subsequent process steps of the method for fabricating the semiconductor device of EMBODIMENT 4.

DESCRIPTION OF THE PREFERRED EMBODIMENTS

EMBODIMENT 1

Hereinafter, a semiconductor device and a fabrication method thereof of EMBODIMENT 1 of the present invention will be described with reference to the relevant drawings.

Figure 1:
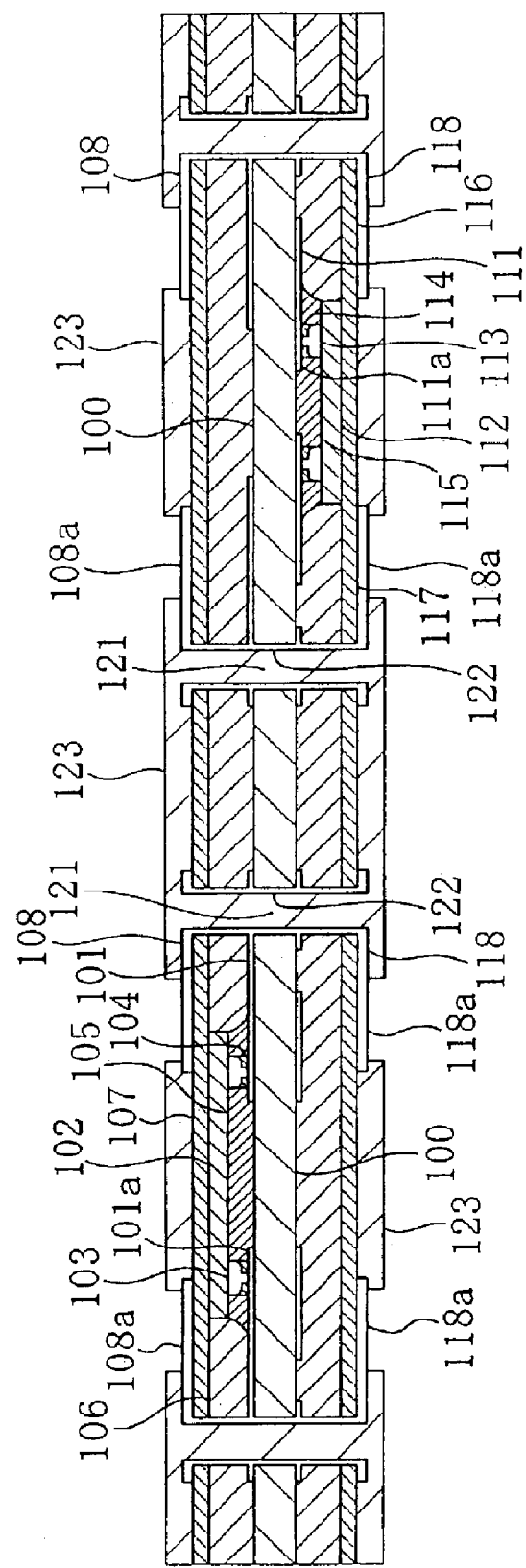
FIG. 1 is a cross-sectional view of a semiconductor device of EMBODIMENT 1 of the present invention.

FIG. 1 illustrates a cross-sectional structure of the semiconductor device of EMBODIMENT 1.

As shown in FIG. 1, a first inner wiring 101 is formed on the top surface of a core substrate 100. On top surface of the core substrate 100, also, mounted is a first semiconductor chip 102 so that the circuit formation surface thereof faces the top surface of the core substrate 100. In more detail, first bumps 103, which are formed on electrodes (not shown) provided on the circuit formation surface of the first semiconductor chip 102, are bonded to first element connection lands 101a of the first inner wiring 101 with conductive paste 104. That is, the first semiconductor chip 102 and the first inner wiring 101 are electrically connected with each other. A first resin layer 105 is formed between the first semiconductor chip 102 and the core substrate 100, and a second resin layer 106 is formed to cover the top surface of the core substrate 100 and the sides of the first semiconductor chip 102. The top surface of the second resin layer 106 is made flush with the top surface of the first semiconductor chip 102. A third resin layer 107 is formed to cover the top surface of the first semiconductor chip 102 and the top surface of the second resin layer 106. A first outer wiring 108 is formed on the third resin layer 107.

A second inner wiring 111 is formed on the bottom surface of the core substrate 100. On the bottom surface of the core substrate 100, also, mounted is a second semiconductor chip 112 so that the circuit formation surface thereof faces the bottom surface of the core substrate 100. In more detail, second bumps 113, which are formed on electrodes (not shown) provided on the circuit formation surface of the second semiconductor chip 112, are bonded to second element connection lands 111a of the second inner wiring 111 with conductive paste 114. That is, the second semiconductor chip 112 and the second inner wiring 111 are electrically connected with each other. A fourth resin layer 115 is formed between the second semiconductor chip 112 and the core substrate 100, and a fifth resin layer 116 is formed to cover the bottom surface of the core substrate 100 and the sides of the second semiconductor chip 112. The bottom surface of the fifth resin layer 116 is made flush with the bottom surface of the second semiconductor chip 112. A sixth resin layer 117 is formed to cover the bottom surface of the second semiconductor chip 112 and the bottom surface of the fifth resin layer 116. A second outer wiring 118 is formed on the sixth Conduction holes. 121 are formed through the core substrate 100 including the resin layers. An interconnection 122 is formed in each of the conduction holes 121 to electrically connect the respective wirings. Both surfaces of the core substrate 100 including the resin layers and the wirings are coated with solder resist films 123, except for first external connection terminals 108a of the first outer wiring 108 and second external connection terminals 118a of the second outer wiring 118.

Figure 2:
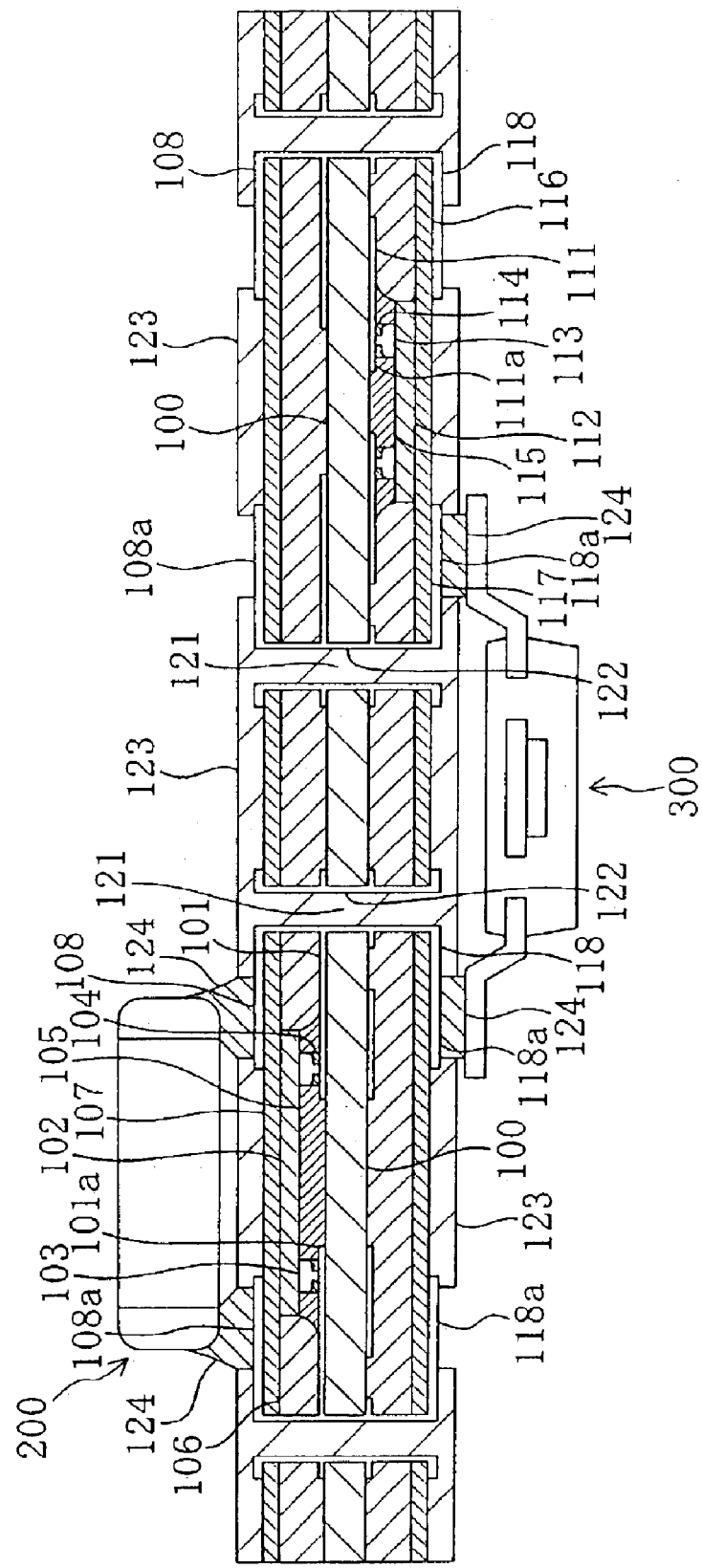
FIG. 2 is a view illustrating connection of the semiconductor device of EMBODIMENT 1 with other electronic components.

FIG. 2 illustrates how the semiconductor device of this embodiment shown in FIG. 1 is connected with other electronic components (including a semiconductor package).

As shown in FIG. 2, electronic components 200 and 300 are connected to the first external connection terminals 108a and the second external connection terminals 118a, respectively, of the semiconductor device of this embodiment via solder material 124. Other conductive materials such as a conductive adhesive may be used in place of the solder material 124. The electronic component 200 is a capacitor, a resistor, or the like, for example. The semiconductor package 300 includes therein a semiconductor chip such as a semiconductor memory and a microcomputer. Although a quad flat package (QFP) type is shown in FIG. 2, the semiconductor package may be of a ball grid array (BGA) type or a chip scale package (CSP) type.

Hereinafter, the method for fabricating a semiconductor device of EMBODIMENT 1 of the present invention will be described, taking as an example fabrication of the semiconductor device of this embodiment shown in FIG. 1 with reference to the relevant drawings.

Figure 3:
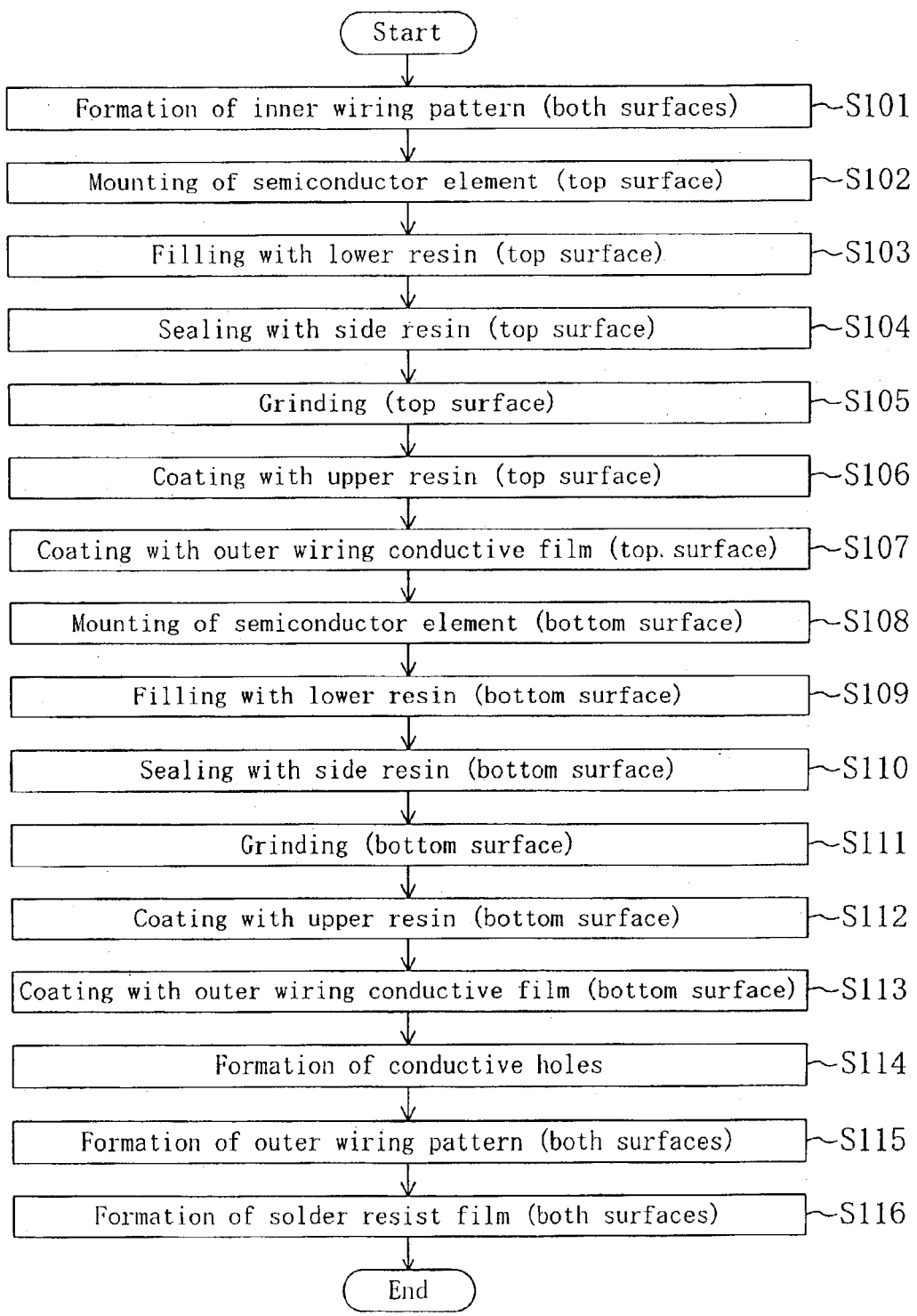
FIG. 3 is a flowchart of a method for fabricating the semiconductor device of EMBODIMENT 1 of the present invention.

FIG. 3 is a flowchart of the fabrication method of EMBODIMENT 1. FIGS. 4A through 4C, 5A through 5C, 6A, and 6B are cross-sectional views illustrating the process steps of the fabrication method of EMBODIMENT 1.

First, referring to FIG. 4A, in step S101, conductive films (not shown) are patterned by a subtractive method, an additive method, or the like, to form the first inner wiring 101 and the second inner wiring 111 on the top and bottom surfaces of the core substrate 100. During this formation, the first element connection lands 101a are formed as part of the first inner wiring 101, and the second element connection lands 111a are formed as part of the second inner wiring 111. Test lands and the like may be formed together with the element connection lands.

Referring to FIG. 4B, in step S102, the conductive paste 104 is applied to the first bumps 103 that have been formed in advance on electrodes (not shown) formed on the circuit formation surface of the first semiconductor chip 102. The first bumps 103 are then bonded to the first element connection lands 101a. That is, the first semiconductor chip 102 is mounted on the top surface of the core substrate 100 so that the circuit formation surface of the first semiconductor chip 102 faces the top surface of the core substrate 100.

Referring to FIG. 4C, in step S103, a liquid resin is filled into the space between the first semiconductor chip 102 and the core substrate 100 and then cured, to form the first resin layer 105 (lower resin).

Figure 5A:
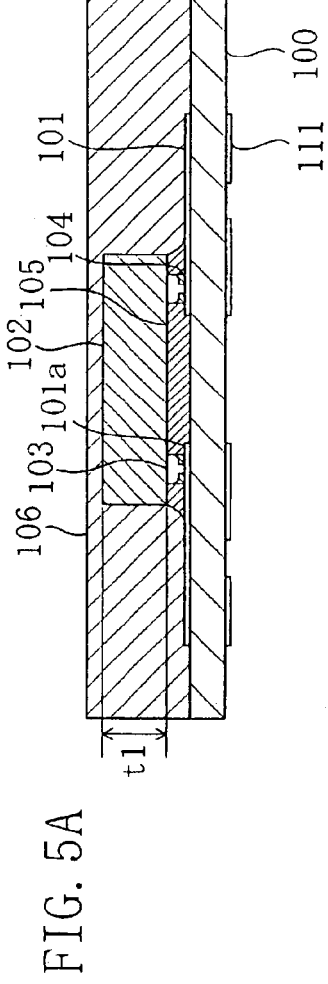
FIGS. 5A through 5C are cross-sectional views illustrating subsequent process steps of the method for fabricating the semiconductor device of EMBODIMENT 1.

Referring to FIG. 5A, in step S104, a liquid resin is applied to cover the top surface of the core substrate 100 including the first semiconductor chip 102 and then cured, to form the second resin layer 106 (side resin).

Figure 5B:
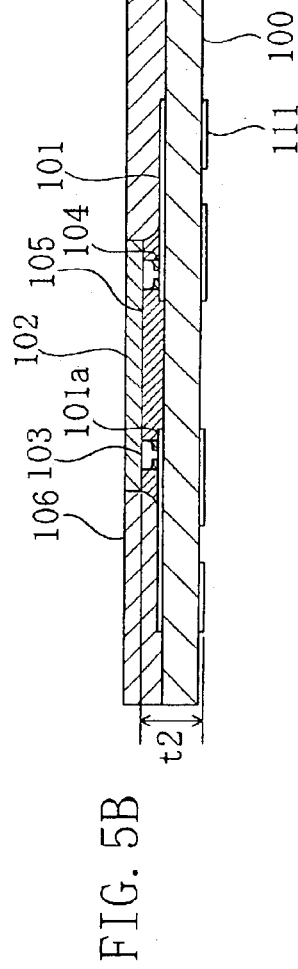

Referring to FIG. 5B, in step S105, the second resin layer 106 and the first semiconductor chip 102 are ground starting from the surfaces opposite to the circuit formation surface of the first semiconductor chip 102, to thin the first semiconductor chip 102 and also to allow the top surface of the first semiconductor chip 102 to be flush with the top surface of the second resin layer 106 after the grinding.

Figure 5C:
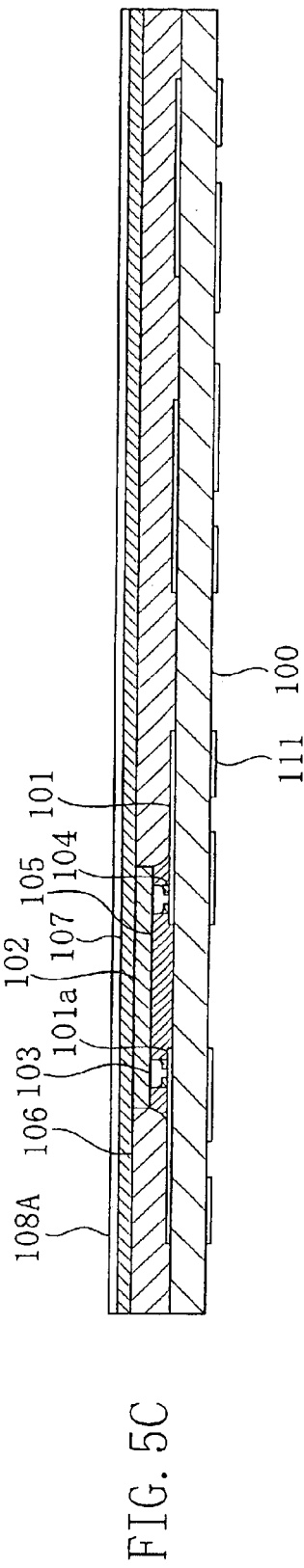

Referring to FIG. 5C, in step S106, the third resin layer 107 (upper resin) is formed to cover the top surface of the first semiconductor chip 102 and the top surface of the second resin layer 106 after the grinding. In step S107, a first outer wiring conductive film 108A is formed on the third resin layer 107.

Thereafter, referring to FIG. 6A, process steps similar to steps S102 through S107 described above are performed. That is, in step S108, the conductive paste 114 is applied to the second bumps 113 that have been formed in advance on electrodes (not shown) provided on the circuit formation surface of the second semiconductor chip 112. The second bumps 113 are then bonded to the second element connection lands 111a. That is, the second semiconductor chip 112 is mounted on the bottom surface of the core substrate 100 so that the circuit formation surface of the second semiconductor chip 112 faces the bottom surface of the core substrate 100. In step S109, a liquid resin is filled into the space between the second semiconductor chip 112 and the core substrate 100 and then cured, to form the fourth resin layer 115 (lower resin). In step S110, a liquid resin is applied to cover the bottom surface of the core substrate 100 including the second semiconductor chip 112 and then cured, to form the fifth resin layer 116 (side resin). In step S111, the fifth resin layer 116 and the second semiconductor chip 112 are ground starting from the surfaces opposite to the circuit formation surface of the second semiconductor chip 112, to thin the second semiconductor chip 112 and also to allow the bottom surface of the second semiconductor chip 112 to be flush with the bottom surface of the fifth resin layer 116 after the grinding. In step S112, the sixth resin layer 117 (upper resin) is formed to cover the bottom surface of the second semiconductor chip 112 and the bottom surface of the fifth resin layer 116 after the grinding. In step S113, a second outer wiring conductive film 118A is formed on the sixth resin layer 117.

Referring to FIG. 6B, in step S114, the conduction holes 121 are formed through the core substrate 100 including the resin layers. On the wall of each of the conductive holes 121, formed is an interconnection 122 for connecting the wirings with each other. In step S115, the first and second outer wiring conductive films 108A and 118A are patterned to form the first and second outer wirings 108 and 118. During this formation, the first external connection terminals 108a are formed as part of the first outer wiring 108, and the second external connection terminals 118a are formed as part of the second outer wiring 118.

Thereafter, the solder resist films 123 are formed to cover the top and bottom surfaces of the core substrate 100 including the resin layers and the wirings, except for the first and second external connection terminals 108a and 118a, to complete the semiconductor device of this embodiment shown in FIG. 1. After the formation of the solder resist films 123, the surfaces of the first and second external connection terminals 108a and 118a may be subjected to surface treatment such as solder plating and gold plating.

As used herein, the "top surface" and the "bottom surface" of the core substrate and the like are used for convenience in identification of the surface to be processed, and are not meant to have a nature distinguished from the other.

In the grinding of the first or second semiconductor chip 102, 112 to thin the resultant semiconductor device, it is required to minimize the variation in the thickness of the first or second semiconductor chip 102, 112 after grinding. If the variation in the thickness of the semiconductor chip after grinding is large while the target value of the thickness of the semiconductor chip after grinding is set small, the grinding of the semiconductor chip may highly possibly reach the circuit formation surface of the semiconductor chip. In order to minimize the variation in the thickness of the semiconductor chip after grinding, the grinding amount of the semiconductor chip is preferably determined using as the reference the grinding start surface of the semiconductor chip (for example, the top surface (surface opposite to the circuit formation surface) of the first semiconductor chip 102 before grinding shown in FIG. 5A). The reason is as follows. The variation in the thickness of the semiconductor chip before grinding (for example, the thickness t1 of the first semiconductor chip 102 shown in FIG. 5A) is smaller than the variation in the height of the semiconductor chip mounted (for example, the height t2 from the bottom surface of the core substrate 100 to the bottom surface of the first semiconductor chip 102 shown in FIG. 5B). Therefore, the variation in the thickness of the semiconductor chip after grinding can be smaller when the grinding amount of the semiconductor chip is determined using the grinding start surface of the semiconductor chip as the reference than when it is determined using the bottom surface of the core substrate 100 as the reference. Note, however, that as for the thickness of the entire semiconductor device including the ground semiconductor chip mounted therein, the variation is smaller when the grinding amount of the semiconductor chip is determined using the bottom surface of the core substrate 100 as the reference. In this case, the thickness t2 described above is assumed in advance to determine the grinding amount of the first semiconductor chip 102, for example, before the grinding of the first semiconductor chip 102. By this determination, the variation in the thickness of the first semiconductor chip 102 after grinding can be reduced to some extent.

In the determination of the grinding amount of the semiconductor chip using the grinding start surface of the semiconductor chip as the reference, the grinding start surface can be detected by any of the following three methods.

The first method is based on the fact that the characteristics related to light reflection and absorption are different between the semiconductor chip and the resin layer. To state specifically, when the first semiconductor chip 102 and the second resin layer 106 are irradiated with light at and around the start of grinding of the semiconductor chip 102, in other words, at and around the time when the grinding of the second resin layer 106 covering the first semiconductor chip 102 has just finished and the grinding of the first semiconductor chip 102 itself starts, the amount of reflection or absorption of the irradiated light changes. This change is detected and the position of the change is regarded as the grinding start surface of the first semiconductor chip 102.

The second method is based on the fact that, in the case of grinding with a rotating grinder such as a grindstone, the grinding drag against the grinder is different between the resin layer and the semiconductor chip. To state specifically, the grinding drag against the grinder changes at and around the time when the grinding of the second resin layer 106 covering the first semiconductor chip 102 has just finished and the grinding of the first semiconductor chip 102 itself starts. Therefore, this change is detected and the position of the change is regarded as the grinding start surface of the first semiconductor chip 102.

The third method is based on the fact that the electrical resistance of a solvent such as water containing chippings from the grinding, namely, grinding water is different between the grinding water containing only chippings of the resin layer and the grinding water containing chippings of the semiconductor chip in addition to chippings of the resin layer. To state specifically, the electrical resistance of the grinding water containing chippings from the grinding of the first semiconductor chip 102 and the second resin layer 106 changes at and around the time when the grinding of the second resin layer 106 covering the first semiconductor hip 102 has just finished and the grinding of the first semiconductor chip 102 itself starts. Therefore, this change is detected and the position of the change is regarded as the grinding start surface of the first semiconductor chip 102.

As described above, in EMBODIMENT 1, the first semiconductor chip 102 is mounted on the top surface of the core substrate 100 so that the circuit formation surface thereof faces the top surface of the core substrate 100. The first semiconductor chip 102 is then ground starting from the surface thereof opposite to the circuit formation surface, to be thinned. Likewise, the second semiconductor chip 112 is mounted on the bottom surface of the core substrate 100 so that the circuit formation surface thereof faces the bottom surface of the core substrate 100. The second semiconductor chip 112 is then ground starting from the surface thereof opposite to the circuit formation surface, to be thinned. Accordingly, it is possible to handle the original thick first or second semiconductor chip 102, 112 during the mounting of the first or second semiconductor chip 102, 112 on the substrate 100. Thus, the formation of the bumps on the semiconductor chip, the mounting of the semiconductor chip on the substrate, and the like can be performed easily and reliably while preventing occurrence of external damage and warp. Moreover, the first or second semiconductor chip 102, 112 mounted on the substrate 100 is thinned by grinding. Therefore, heat generated due to the operation of the semiconductor chip is easily dissipated. In addition, when such semiconductor chips are layered in a semiconductor device, the thickness of the resultant semiconductor device can be small. As a result, it is possible to easily fabricate a thin semiconductor device with high reliability and high heat dissipation in which semiconductor chips are packaged with high density.

In EMBODIMENT 1, the resin layers are formed symmetrically with respect to the core substrate 100. This balances shrinkage of the resin layers on both surfaces of the core substrate 100 and thus serves to minimize the amount of warp of the semiconductor device.

In EMBODIMENT 1, the first or second semiconductor chip 102, 112 is ground while being surrounded and sealed with the resin. That is, the semiconductor chip is ground in the immobilized state. This makes it possible to thin the semiconductor chip to as small as about 100 $\mu$m or less, for example, while suppressing occurrence of external damage on the semiconductor chip due to the grinding, that is, preventing deterioration of the quality of the semiconductor device. If the semiconductor chip is mounted on the substrate after it has been thinned as in the conventional technique, external damage tends to occur on the semiconductor chip, and thus it is difficult to obtain a good-quality semiconductor device. Actually, it is preferable to thin the semiconductor chip in advance to a level of thickness with which external damage will not occur during the mounting on the substrate and the like, and then mount the semiconductor chip on the substrate. This reduces the amount of grinding of the semiconductor chip and thereby improves the efficiency of the fabrication of the semiconductor device.

In EMBODIMENT 1, the first or second semiconductor chip 102, 112 is mounted on the top or bottom surface of the core substrate 100 and then covered with the resin layers. This simplifies the fabrication process compared with the conventional technique where an opening is formed through the insulating layer on the substrate and the semiconductor chip is buried in the opening together with the resin. This also prevents occurrence of the prior art problem of separation at the interface between the insulating layer having the opening and the resin layer filled in the opening, and thus a high-quality semiconductor device is attained.

In EMBODIMENT 1, when the second semiconductor chip 112 is ground, the first semiconductor chip 102, which is under protection of the third resin layer 107 and the first outer wiring 108, is less susceptible to mechanical damage.

In EMBODIMENT 1, the first resin layer 105 is formed between the first semiconductor chip 102 and the core substrate 100 before formation of the second resin layer 106 to cover the sides of the first semiconductor chip 102. Likewise, the fourth resin layer 115 is formed between the second semiconductor chip 112 and the core substrate 100 before formation of the fifth resin layer 116 to cover the sides of the second semiconductor chip 112. This suppresses generation of voids in the first and fourth resin layers 105 and 115, and thus improves the reliability of the semiconductor device.

In EMBODIMENT 1, the top surface of the first semiconductor chip 102 is flush with the top surface of the second resin layer 106. This facilitates the formation of the third resin layer 107 and then the first outer wiring 108 on the first semiconductor chip 102 and the second resin layer 106. Likewise, the bottom surface of the second semiconductor chip 112 is flush with the bottom surface of the fifth resin layer 116. This facilitates the formation of the sixth resin layer 117 and then the second outer wiring 118 under the second semiconductor chip 112 and the fifth resin layer 116.

In EMBODIMENT 1, the third resin layer 107 formed-on the top surface of the first semiconductor chip 102 serves not only to protect the first semiconductor chip 102 from external defect, but also to electrically insulate the top surface of the first semiconductor chip 102 from the first external wire 108. Likewise, the sixth resin layer 117 formed on the bottom surface of the second semiconductor chip 112 serves to not only protect the second semiconductor chip 112 from external defect, but also to electrically insulate the bottom surface of the second semiconductor chip 112 from the second external wire 118. This facilitates the handling of the semiconductor device with the thin semiconductor chips packaged therein.

In EMBODIMENT 1, the first external connection terminals 108a are formed as part of the first outer wiring 108 and the second external connection terminals 118a are formed as part of the second outer wiring 118. This enables other electrical components to be electrically and mechanically connected to the semiconductor device via the external connection terminals, and thus a good-quality, large-scale, multi-function electric circuit system can be attained efficiently. If the first and second external connection terminals 108a and 118a are formed in the same regions when viewed from a position above the core substrate 100, it is possible to stack a plurality of semiconductor devices of this embodiment on top of each other and electrically and mechanically connect with each other. Thus, a good-quality, large-scale, multi-function electric circuit system can be attained efficiently.

In EMBODIMENT 1, the solder resist films 123 are formed to cover both surfaces of the core substrate 100 including the resin layers and the wirings. Therefore, in the occasion of connecting the semiconductor device of this embodiment with another electrical component using solder, solder connection with good quality is ensured.

In EMBODIMENT 1, examples of the material of the core substrate 100 include rigid resin substrates made of glass epoxy, glass bismaleimide triazine, and the like, flexible resin substrates made of polyimide films and the like, and ceramic substrates. When a rigid substrate is used as the core substrate 100, it can reliably retain the first or second semiconductor chip 102, 112. This advantageously facilitates fabrication of the semiconductor device. When a flexible substrate is used as the core substrate 100, the core substrate 100 can be thinned. Although the double-sided board was used as the core substrate 100 in the illustrate example, the same effects can also be obtained by using a multilayer board.

In EMBODIMENT 1, as the first and second bumps 103 and 113 formed on electrodes of the first and second semiconductor chips 102 and 112, stud bumps, plated bumps, ball bumps, and the like made of metal such as gold, nickel, solder, and the like may be used. This ensures good electrical connection between the first semiconductor chip 102 and the first inner wiring 101 and between the second semiconductor chip 112 and the second inner wiring 111.

In Embodiment 1, the first bumps 103 and the first element connection lands 101a were connected with each other using the conductive paste 104, and the second bumps 113 and the second element connection lands 111a were connected with each other using the conductive paste 114. Alternatively, the first bumps 103 and the first element connection lands 101a may be connected by soldering, and the second bumps 113 and the second element connection lands 111a may be connected by soldering. Otherwise, the first and second bumps 103 and 113 may not be used, but the electrodes of the first semiconductor chip 102 may be connected with the first element connection lands 101a and the electrodes of the second semiconductor chip 112 may be connected with the second element connection lands 111a by a method utilizing tape automated bonding (TAB). When TAB is utilized, the first semiconductor chips 102 and the second semiconductor chips 112 can be bonded to the substrate in a short time even when they are multi-pin chips.

In EMBODIMENT 1, metal such as copper may be used as the material of the first and second inner wirings 101 and 111 and the first and second outer wirings 108 and 118.

In EMBODIMENT 1, the second resin layer 106 was formed on the sides of the first semiconductor chip 102 after the formation of the first resin layer 105 between the first semiconductor chip 102 and the core substrate 100. Alternatively, the first resin layer 105 may be formed as part of the second resin layer 106 by filling the resin into the space between the first semiconductor chip 102 and the core substrate 100 during the formation of the second resin layer 106. This simplifies the fabrication process. Moreover, this prevents reduction in the reliability and quality of the semiconductor device due to thermal fatigue and the like because the circuit formation surface and the sides of the first semiconductor chip 102 are covered with the resin having the same characteristics.

Likewise, in EMBODIMENT 1, the fifth resin layer 116 was formed on the sides of the second semiconductor chip 112 after the formation of the fourth resin layer 115 between the second semiconductor chip 112 and the core substrate 100. Alternatively, the fourth resin layer 115 may be formed as part of the fifth resin layer 116 by filling the resin into the space between the second semiconductor chip 112 and the core substrate 100 during the formation of the fifth resin layer 116. This simplifies the fabrication process. Moreover, this prevents reduction in the reliability and quality of the semiconductor device due to thermal fatigue and the like because the circuit formation surface and the sides of the second semiconductor chip 112 are covered with the resin having the same characteristics.

In EMBODIMENT 1, a filler made of an inorganic material such as silicon oxide and aluminum oxide is preferably mixed in the second or fifth resin layer 106, 116. The filler-mixed second resin layer 106 has a hardness closer to that of the first semiconductor chip 102, and thus the second resin layer 106 and the first semiconductor chip 102 can be ground simultaneously and uniformly. Likewise, the filler-mixed fifth resin layer 116 has a hardness closer to that of the second semiconductor chip 112, and thus the fifth resin layer 116 and the second semiconductor chip 112 can be ground simultaneously and uniformly. This enables fabrication of a high-quality semiconductor device. Moreover, by mixing a filler, it is possible to reduce the thermal expansion coefficient and curing shrinkage coefficient of the second or fifth resin layer 106, 116. This reduces the amount of stress of the second or fifth resin layer 106, 116 acting on the first or second semiconductor chip 102, 112, and thus warping of the semiconductor chip is made small. As a result, a higher-quality semiconductor device can be fabricated. If no filler is mixed in the second or fifth resin layer 106, 116, the second or fifth resin layer 106, 116 is softer than the first or second semiconductor chip 102, 112. The grinding speed therefore differs between the first or second semiconductor chip 102, 112 and the second or fifth resin layer 106, 116. As a result, the ground surface of the second or fifth resin layer 106, 116 including the first or second semiconductor chip 102, 112 tends to be uneven.

In EMBODIMENT 1, as the material of the second and fifth resin layers 106 and 116, a liquid resin is preferably used due to its superiority in sealing and filling of uneven surfaces. As the formation method for the second and fifth resin layers 106 and 116, printing, curtain coating, or the like is preferably employed.

In EMBODIMENT 1, a resin of a thermosetting type, a photocuring type, or a thermosetting photocuring combined type is preferably used as the material of the second and fifth resin layers 106 and 116. In the case of using a resin of the thermosetting photocuring combined type, the resin is cured in advance with light and then further cured with heat. By the curing in this manner, while the resin can be sufficiently cured, it is possible to minimize the curing shrinkage of the resin and thus reduce the warp of the resultant semiconductor device after the curing of the second or fifth resin layer 106, 116.

In EMBODIMENT 1, the second resin layer 106 preferably covers the top surface (surface opposite to the circuit formation surface) of the first semiconductor chip 102 at the time before the start of grinding for the first semiconductor chip 102. Because, with the covering of the second resin layer 106, the surface to be ground at the start of the grinding for the first semiconductor chip 102 (that is, the surface of the second resin layer 106) is less uneven, and therefore good grinding is possible. Likewise, the fifth resin layer 116 preferably covers the bottom surface (surface opposite to the circuit formation surface) of the second semiconductor chip 112 at the time before the start of grinding for the second semiconductor chip 112. Because, with the covering of the fifth resin layer 116, the surface to be ground at the start of the grinding for the second semiconductor chip 112 (that is, the surface of the fifth resin layer 116) is less uneven, and therefore good grinding is possible.

In EMBODIMENT 1, the second or fifth resin layer 106, 116 is preferably formed under a pressure lower than the atmospheric pressure. This improves the filling ability of the resin, and thus good resin sealing is attained even for uneven portions and portions having narrow gaps while suppressing generation of voids. In general, if a void exists in a sealing resin, circuit wiring and the like of a semiconductor chip tend to corrode, and thus the reliability and quality of the semiconductor device tend to decrease. Therefore, in order to obtain a semiconductor device with good reliability and quality, generation of a void must be suppressed during the resin sealing. In particular, in the case that the space between the semiconductor chip and the substrate is sealed with resin simultaneously with the resin sealing of the sides of the semiconductor chip and the like, the application of a pressure lower than the atmospheric pressure is effective in suppressing generation of a void during the resin sealing of the space between the semiconductor chip and the substrate.

In EMBODIMENT 1, the first or second semiconductor chip 102, 112 can be ground by a method using a grindstone, a method where the surface to be ground is irradiated with plasma, a method using erosion with an agent, or the like.

In EMBODIMENT 1, the second resin layer 106 and the third resin layer 107 are preferably made of different materials. Likewise, the fifth resin layer 116 and the sixth resin layer 117 are preferably made of different materials. By using different materials, the second and third resin layers 106 and 107 or the fifth and sixth resin layers 116 and 117 are different from each other in characteristics such as resin flow filling ability, thickness uniformity, adhesion, mechanical strength, and the like. This enables easy fabrication of a high-quality semiconductor device.

In EMBODIMENT 1, the third or sixth resin layer 107, 117 can be formed by curing a liquid resin, a film resin, a resin in resin-added copper foil, or the like. In the case of forming the third or sixth resin layer 107, 117 by curing a resin in resin-added copper foil, it is possible to secure a uniform thickness for the third or sixth resin layer 107, 117. Moreover, the first or second outer wiring conductive film 108A, 118A can be formed simultaneously with the third or sixth resin layer 107, 117, and thus the fabrication efficiency of the semiconductor device can be improved. In the case of forming the third or sixth resin layer 107, 117 by curing a liquid resin or a film resin, the first or second outer wiring conductive film 108A and 118A is formed by plating, copper-foil bonding, or the like after the formation of the third or sixth resin layer 107, 117. In the case of forming the third or sixth resin layer 107, 117 by curing a liquid resin, the liquid resin is applied to the surface of the second resin layer 106 including the first semiconductor chip 102 or the surface of the fifth resin layer 116 including the second semiconductor chip 112 by printing, curtain coating, or the like while keeping the thickness of the resin uniform. In this way, good resin filling ability is secured even when the surface of the resin layer is considerably uneven. In the case of forming the third or sixth resin layer 107, 117 by curing a film resin, it is easy to secure a uniform thickness for the third or sixth resin layer 107, 117.

In EMBODIMENT 1, the process step of forming the first or second outer wiring conductive film 108A, 118A can be omitted if the first or second outer wiring 108, 118 is formed by an additive method.

In EMBODIMENT 1, the first outer wiring conductive film 108A was formed immediately after the formation of the third resin layer 107. Alternatively, the formation of the first outer wiring conductive film 108A may be performed after the formation of the sixth resin layer 117 and simultaneously with the formation of the second outer wiring conductive film 118A. Also, the formation of the third resin layer 107 and the formation of the first outer wiring conductive film 108A were performed immediately after the grinding of the first semiconductor chip 102. Alternatively, the formation of the third resin layer 107 and the formation of the first outer wiring conductive film 108A may be performed after the grinding of the second semiconductor chip 112 and simultaneously with the formation of the six resin layer 117 and the formation of the second outer wiring conductive film 118A. Thus, by increasing the number of process steps in which the two surfaces of the core substrate are simultaneously processed, the productivity of the semiconductor device improves. In particular, in the simultaneous formation of the third resin layer 107 and the first outer wiring conductive film 108A with the sixth resin layer 117 and the second outer wiring conductive film 118A after the grinding of the second semiconductor chip 112, if the third resin layer 107 and the sixth resin layer 117 are made by curing a resin of resin-added copper foil, the process steps of forming the first and second outer wiring conductive films 108A and 118A can be omitted. This further improves the productivity of the semiconductor device.

In EMBODIMENT 1, as the conductive holes 121, through holes, blind interstitial via holes (IVHs), or buried IVHs, which electrically connect different wiring layers with each other, may be used. In FIG. 1, only through holes are formed as the conductive holes 121. In the case of forming IVHs as the conductive holes 121, holes are formed in the following manner to attain the semiconductor device of this embodiment. IVHs are formed through the core substrate 100 prior to the mounting of the first and second semiconductor chips 102 and 112, IVHs are formed through the second and third resin layers 106 and 107 after the formation of the third resin layer 107, and IVHs are formed through the fifth and sixth resin layers 116 and 117 after the formation of the sixth resin layer 117. In order to secure the electrical conduction through the conduction holes 121, the wall of each of the conduction holes 121 may be plated with a metal such as copper and silver. Alternatively, the conductive holes 121 may be filled with conductive resin paste. In EMBODIMENT 1, the method for electrically connecting the wirings is not specifically limited.

In EMBODIMENT 1, the solder resist films 123 were formed to cover both surfaces of the core substrate 100 including the resin layers and the wirings. The formation of the solder resist films 123 is not necessary if another electrical component is not to be connected to the semiconductor device of this embodiment.

In EMBODIMENT 1, one layer of the semiconductor chip was mounted on each of the opposite surfaces of the core substrate 100. Alternatively, two or more layers of semiconductor chips may be mounted on each of the opposite surfaces of the core substrate 100. Semiconductor chips in the second and higher-order layers on each surface of the core substrate 100 can be mounted in the manner described above. In this way, a thin semiconductor device with high reliability and high heat dissipation in which semiconductor chips are packaged with high density can be easily fabricated. Specifically, in this embodiment, after the formation of the first outer wiring 108 on the top surface of the third resin layer 107, a third semiconductor chip is mounted on the top surface of the third resin layer 107 so that the circuit formation surface of the third semiconductor chip faces the top surface of the core substrate 100 and that electrodes on the circuit formation surface connect with the first outer wiring 108. Subsequently, a resin layer is formed over the top surface of the third resin layer 107 to cover the third semiconductor chip. The newly formed resin layer and the third semiconductor chip are then ground from the surfaces opposite to the circuit formation surface of the third semiconductor chip, to thin the third semiconductor chip. Likewise, after the formation of the second outer wiring 118 on the bottom surface of the sixth resin layer 117, a fourth semiconductor chip is mounted on the bottom surface of the sixth resin layer 117 so that the circuit formation surface of the fourth semiconductor chip faces the bottom surface of the core substrate 100 and that electrodes on the circuit formation surface connect with the second outer wiring 118. Subsequently, a resin layer is formed over the bottom surface of the sixth resin layer 117 to cover the fourth semiconductor chip. The newly formed resin layer and the fourth semiconductor chip are then ground from the surfaces opposite to the circuit formation surface of the fourth semiconductor chip, to thin the fourth semiconductor chip. By repeating the above process steps, a semiconductor device including semiconductor chips in an arbitrary number of layers can be easily attained. The numbers of layers of semiconductor chips are preferably the same on both surfaces of the core substrate 100. This balances the shrinkage of the resin layers on both surfaces of the core substrate 100, and thus minimizes the warp of the semiconductor device.

(First Modification of EMBODIMENT 1)

A first modification of the semiconductor device and the fabrication method thereof of EMBODIMENT 1 of the present invention will be described with reference to the relevant drawings.

Figure 8:
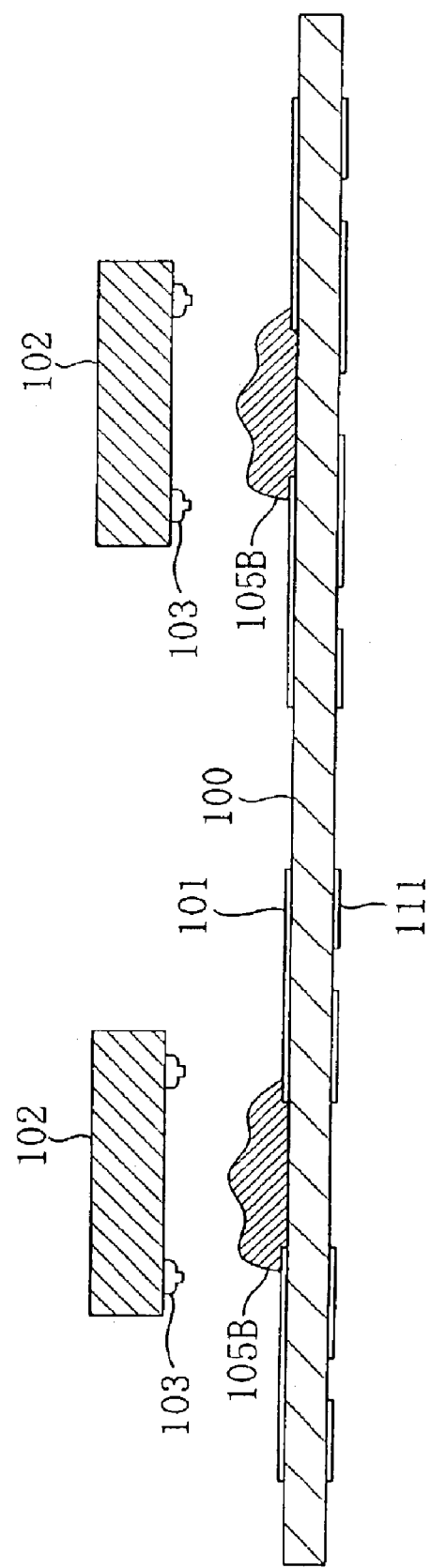
FIG. 8 is a cross-sectional view illustrating a process step of an alternative of the first modification of the method for fabricating the semiconductor device of EMBODIMENT 1.

FIGS. 7 and 8 are cross-sectional views illustrating one process step of the method for fabricating the semiconductor device of the first modification of EMBODIMENT 1.

This modification is different from the method of EMBODIMENT 1 described above in the mounting of the semiconductor chips on the substrate.

Specifically, in the method of EMBODIMENT 1 described above, as shown in FIG. 4B, the first semiconductor chip 102, for example, was mounted on the top surface of the core substrate 100 by connecting the first bumps 103 formed on electrodes (not shown) provided on the circuit formation surface of the first semiconductor chip 102 with the first element connection lands 101a of the first inner wiring 101 using the conductive paste 104.

In the first modification, as shown in FIG. 7, the first semiconductor chip 102, for example, is pressed against the top surface of the core substrate 100 via an adhesive film 105A so that the first bumps 103 are connected with the first element connection lands 101a. Alternatively, as shown in FIG. 8, the first semiconductor chip 102, for example, is pressed against the top surface of the core substrate 100 via an adhesive 105B so that the first bumps 103 are connected with the first element connection lands 101a. The adhesive film 105A or the adhesive 105B serves as the first resin layer 105 after completion of the mounting of the first semiconductor chip 102 on the core substrate 100.

Note that FIGS. 7 and 8 illustrate the case of mounting a pair of first semiconductor chips 102 on the top surface of the core substrate 100.

Thus, in the first modification of EMBODIMENT 1, the first semiconductor chip 102 is pressed against and bonded to the top surface of the core substrate 100 with the adhesive film 105A or the adhesive 105B. Therefore, formation of the first resin layer 105 can be realized simultaneously with the mounting of the first semiconductor chip 102 on the core substrate 100. This simplifies the fabrication process.

The first modification of EMBODIMENT 1 was described in relation to the first semiconductor chip 102. The second semiconductor chip 112 can also be mounted on the bottom surface of the core substrate 100 in the manner described above.

In the first modification of EMBODIMENT 1, conductive particles are preferably mixed in the adhesive film 105A or the adhesive 105B. This secures good conduction between the first bumps 103 and the first element connection lands 101a even when the first bumps 103 fail to completely break through the adhesive film 105 or the adhesive 105B.

(Second Modification of EMBODIMENT 1)

A second modification of the semiconductor device and the fabrication method thereof of EMBODIMENT 1 of the present invention will be described with reference to the relevant drawings.

Figure 9:
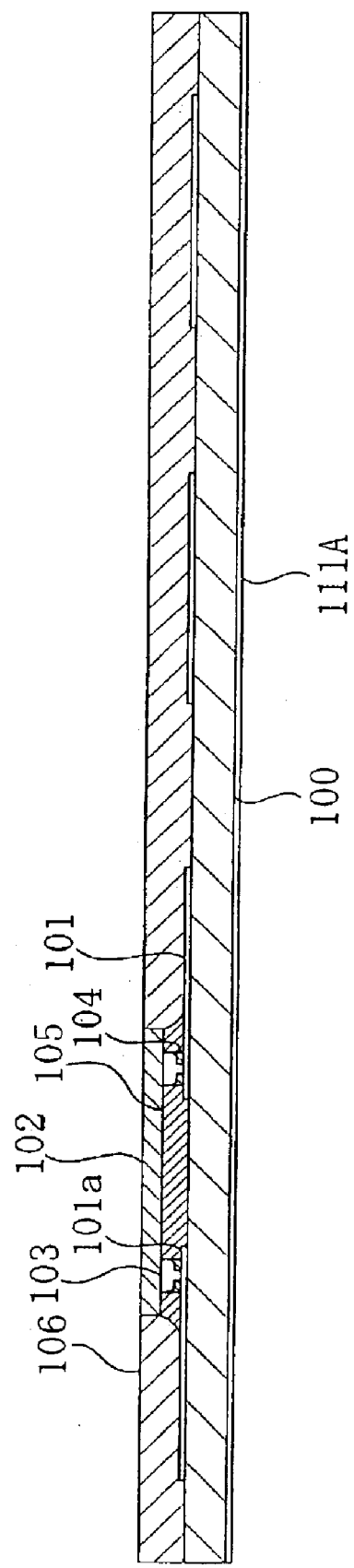
FIG. 9 is a cross-sectional view illustrating a process step of a second modification of the method for fabricating the semiconductor device of EMBODIMENT 1 of the present invention.
Figure 10:
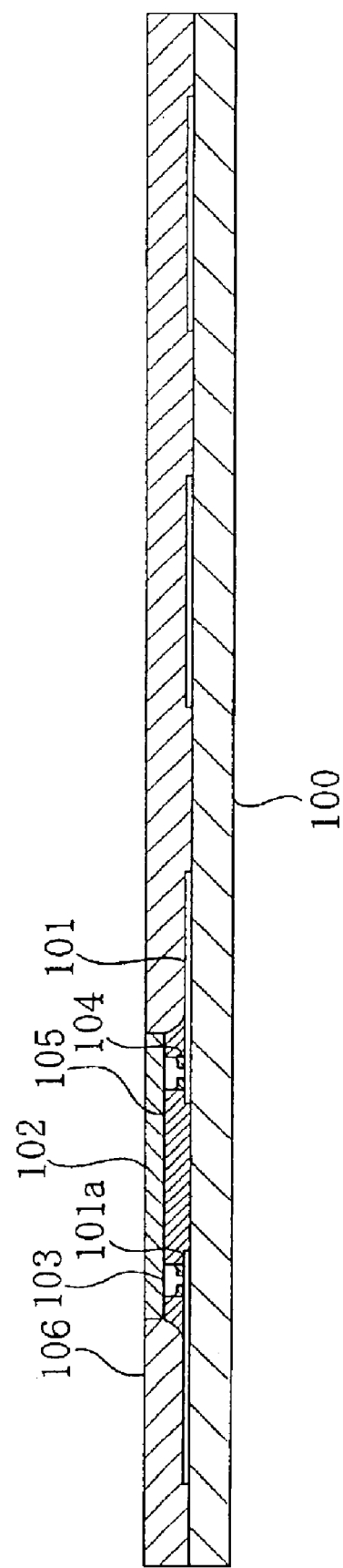
FIG. 10 is a cross-sectional view illustrating a process step of an alternative of the second modification of the method for fabricating the semiconductor device of EMBODIMENT 1.

FIGS. 9 and 10 are cross-sectional views illustrating one process step of the method for fabricating the semiconductor device of the second modification of EMBODIMENT 1.

This modification is different from the method of EMBODIMENT 1 described above in the state of the bottom surface of the core substrate 100 during the grinding of the first semiconductor chip 102.

Specifically, in the method of EMBODIMENT 1 described above, as shown in FIG. 5B, the second inner wiring 111 had been formed on the bottom surface of the core substrate 100 when the first semiconductor chip 102 was ground. This means that the bottom surface of the core substrate 100 was uneven with the wiring pattern formed thereon.

In the second modification of EMBODIMENT 1, as shown in FIG. 9, the first semiconductor chip 102 is ground when the second inner wiring conductive film 111A has not been patterned into the second inner wiring 111. Alternatively, as shown in FIG. 10, the first semiconductor chip 102 is ground when the second inner wiring 111 has not been formed. The formation of the second inner wiring 111 (or, in the case of FIG. 9, the patterning of the second inner wiring conductive film 111A) is performed after the grinding of the first semiconductor chip 102. In other words, in the second modification of EMBODIMENT 1, step S101 (formation of inner wiring pattern) of the flowchart shown in FIG. 3 is divided into formation of the first inner wiring 101 to be performed before the mounting of the first semiconductor chip 102 on the top surface of the core substrate 100 and formation of the second inner wiring 111 to be performed after the grinding of the first semiconductor chip 102 and before the mounting of the second semiconductor chip 112 on the bottom surface of the core substrate 100.

Thus, in the second modification of EMBODIMENT 1, the first semiconductor chip 102 is ground in the state where the second inner wiring conductive film 111A has been formed on the bottom surface of the core substrate 100 but has not been patterned into the second inner wiring 111, or where the second inner wiring 111 has not been formed on the bottom surface of the core substrate 100. Therefore, the unevenness is small at the bottom surface of the core substrate 100 as the surface opposite to the surface to be ground of the core substrate 100 including the first semiconductor chip 102. It is therefore possible to grind the surface to be ground uniformly and thus suppress generation of damage and the like in the first semiconductor chip 102. As a result, a good-quality semiconductor device can be fabricated.

(Third Modification of EMBODIMENT 1)

A third modification of the semiconductor device and the fabrication method thereof of EMBODIMENT 1 of the present invention will be described with reference to the relevant drawings.

FIGS. 11A through 11C are cross-sectional views illustrating process steps of the method for fabricating the semiconductor device of the third modification of EMBODIMENT 1.

This modification is different from the method of EMBODIMENT 1 described above in the timing at which the grinding of the first semiconductor chip 102 is performed.

Specifically, in EMBODIMENT 1 described above, as shown in FIGS. 5A through 5C, the grinding of the first semiconductor chip 102 was performed immediately after the formation of the second resin layer 106, and followed by the formation of the third resin layer 107 and the formation of the first outer wiring conductive film 108A. Thereafter, as shown in FIG. 6A, the second semiconductor chip 112 was mounted on the bottom surface of the core substrate 100.

In the third modification of EMBODIMENT 1, as shown in FIGS. 11A through 11C, after the formation of the second resin layer 106, the second semiconductor chip 112 is mounted on the bottom surface of the core substrate 100, and then the fifth resin layer 116 is formed to cover the second semiconductor chip 112. Thereafter, the grinding of the first semiconductor chip 102 and then the grinding of the second semiconductor chip 112 are consecutively performed. Thereafter, although illustration is omitted, the formation of the third resin layer 107 and the first outer wiring conductive film 108A and the formation of the sixth resin layer 117 and the second outer wiring conductive film 118A follow.

Note that FIGS. 11A through 11C illustrate the case of mounting a pair of first semiconductor chips 102 and a pair of second semiconductor chips 112 on the top and bottom surfaces of the core substrate 100, respectively.

Note also that FIGS. 11A through 11C illustrate the case where the first resin layer 105 and the fourth resin layer 115 are formed as part of the second resin layer 106 and the fifth resin layer 116, respectively, and thus the first and fourth resin layers 105 and 115 are not particularly shown.

In the third modification of EMBODIMENT 1, the thickness of the entire core substrate including the resin layers is large at the time of grinding of the first semiconductor chip 102. Therefore, the core substrate 100 is less likely to warp during the grinding of the first semiconductor chip 102, and thus the handling is facilitated.

In the third modification of EMBODIMENT 1, preferably, the second resin layer 106 is loosely cured when being formed on the top surface of the core substrate 100, and then fully cured together with the fifth resin layer 116 when the fifth resin layer 116 is formed on the bottom surface of the core substrate 100. By adopting this procedure, substantially the same degree of curing shrinkage occurs simultaneously in the second and fifth resin layers 106 and 116, and thus warp less occurs in the first and second semiconductor chips 102 and 112, compared with the case of fully curing the second and fifth resin layers 106 and 116 separately.

EMBODIMENT 2

Hereinafter, a semiconductor device and a fabrication method thereof of EMBODIMENT 2 of the present invention will be described with reference to the relevant drawings.

Figure 12:
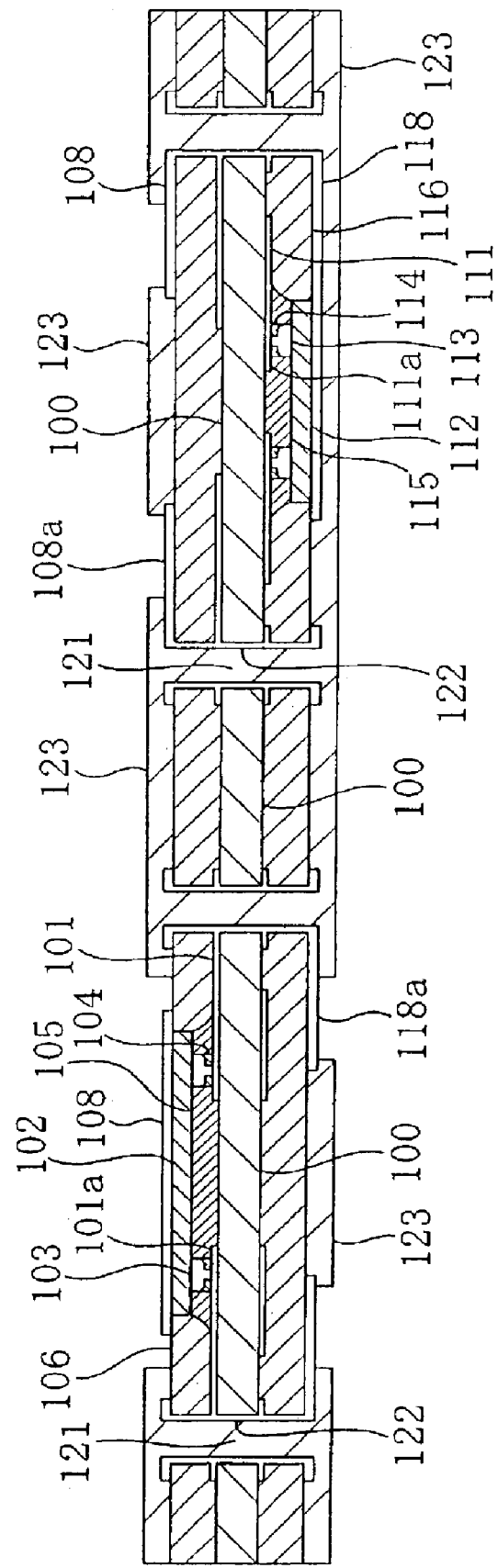
FIG. 12 is a cross-sectional view of a semiconductor device of EMBODIMENT 2 of the present invention.

FIG. 12 illustrates a cross-sectional structure of the semiconductor device of EMBODIMENT 2.

As shown in FIG. 12, EMBODIMENT 2 is different from EMBODIMENT 1 in that the first outer wiring 108 is directly formed on the top surface (surface opposite to the circuit formation surface) of the first semiconductor chip 102 without the intervening third resin layer 107 and that the second outer wiring 118 is directly formed on the bottom surface (surface opposite to the circuit formation surface) of the second semiconductor chip 112 without the intervening sixth resin layer 117. In other words, the third resin layer 107 and the sixth resin layer 117 are not formed in EMBODIMENT 2.

Hereinafter, the method for fabricating a semiconductor device of EMBODIMENT 2 of the present invention will be described, taking as an example fabrication of the semiconductor device of this embodiment shown in FIG. 12 with reference to the relevant drawings.

Figure 13A:
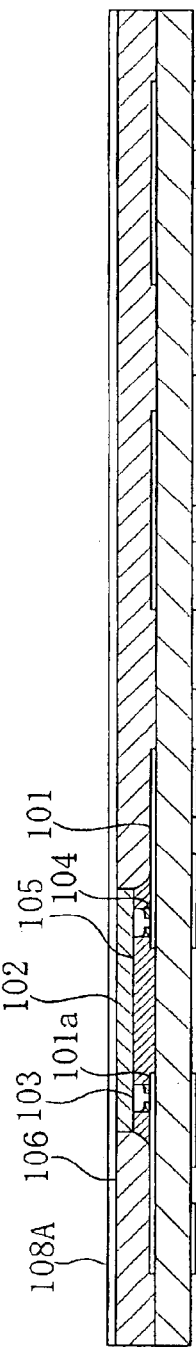
FIGS. 13A through 13C are cross-sectional views illustrating the process steps of a method for fabricating the semiconductor device of EMBODIMENT 2 of the present invention.
Figure 13B:
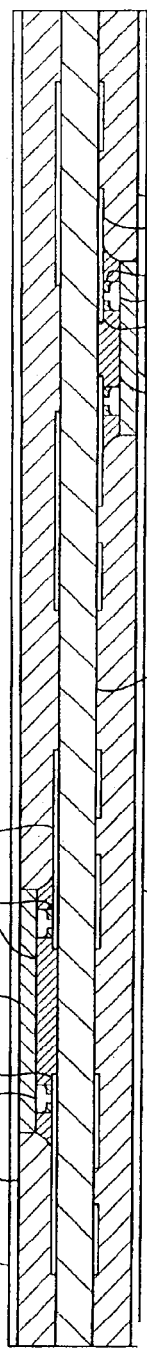
Figure 13C:
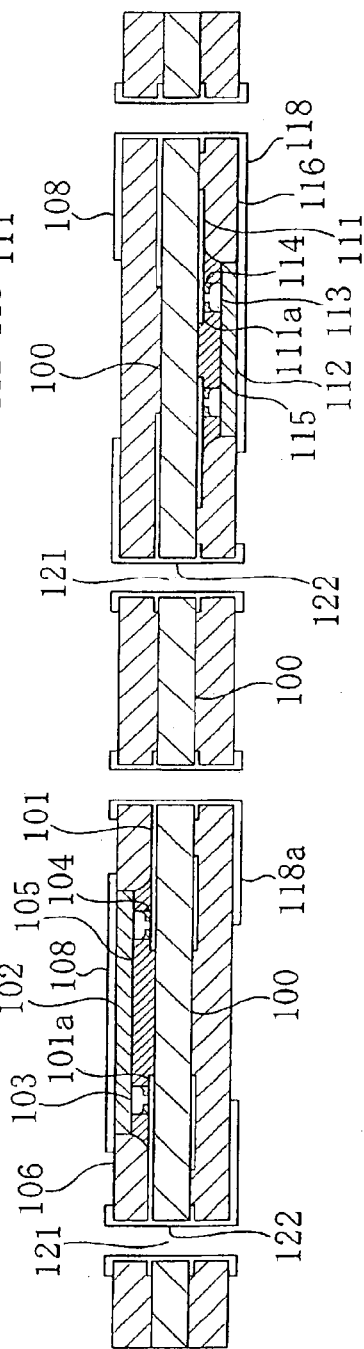

FIGS. 13A through 13C are cross-sectional views illustrating the process steps of the method for fabricating a semiconductor device of EMBODIMENT 2. Note that the process steps preceding that shown in FIG. 13A in the fabrication method of EMBODIMENT 2 are the same as the process steps shown in FIGS. 4A through 4C, 5A, and 5B in the fabrication method of EMBODIMENT 1.

In the process step shown in FIG. 5B, the second resin layer 106 and the first semiconductor chip 102 are ground starting from the surface opposite to the circuit formation surface of the first semiconductor chip 102, to thin the first semiconductor chip 102 and also to allow the top surface of the first semiconductor chip 102 to be flush with the top surface of the second resin layer 106 after the grinding. Thereafter, as shown in FIG. 13A, the first outer wiring conductive film 108A is formed on the second resin layer 106 including the first semiconductor chip 102.

As shown in FIG. 13B, the conductive paste 114 is applied to the second bumps 113 that have been formed in advance on electrodes (not shown) provided on the circuit formation surface of the second semiconductor chip 112. The second bumps 113 are then bonded to the second element connection lands 111a of the second inner wiring 111. That is, the second semiconductor chip 112 is mounted on the bottom surface of the core substrate 100 so that the circuit formation surface of the second semiconductor chip 112 faces the bottom surface of the core substrate 100. A liquid resin is filled into the space between the second semiconductor chip 112 and the core substrate 100 and then cured, to form the fourth resin layer 115. Thereafter, a liquid resin is formed to cover the bottom surface of the core substrate 100 including the second semiconductor chip 112 and then cured, to form the fifth resin layer 116. The fifth resin layer 116 and the second semiconductor chip 112 are ground starting from the surface opposite to the circuit formation surface of the second semiconductor chip 112, to thin the second semiconductor chip 112 and also to allow the bottom surface of the second semiconductor chip 112 to be flush with the bottom surface of the fifth resin layer 116 after the grinding. Thereafter, the second outer wiring conductive film 118A is formed on the bottom surface of the fifth resin layer 116 including the second semiconductor chip 112.

As shown in FIG. 13C, the conduction holes 121 are formed through the core substrate 100 including the resin layers. On the wall of each of the conductive holes 121, formed is an interconnection 122 for connecting the wirings with each other. The first and second outer wiring conductive films 108A and 118A are then patterned to form the first and second outer wirings 108 and 118 so as to cover the top surface of the first semiconductor chip 102 and the bottom surface of the second semiconductor chip 112, respectively.

During this formation, the first external connection terminals 108a are formed as part of the first outer wiring 108. Likewise, the second external connection terminals 118a are formed as part of the second outer wiring 118.

Thereafter, the solder resist films 123 are formed to cover the top and bottom surfaces of the core substrate 100 including the resin layers and the wirings, except for the portion of the first outer wiring 108 located on the top surface of the first semiconductor chip 102, and the first and second external connection terminals 108a and 118a, to complete the semiconductor device of this embodiment shown in FIG. 12.

In EMBODIMENT 2, the first outer wiring 108 is formed in direct contact with the top surface of the first semiconductor chip 102, and the second outer wiring 118 is formed in direct contact with the bottom surface of the second semiconductor chip 112. This construction provides the following effects, in place of the effects obtained by forming the third resin layer 107 and the sixth resin layer 117 in EMBODIMENT 1 (see FIG. 1).

By using a metal with good thermal conductivity and electrical conductivity, such as copper, as the material of the first and second outer wirings 108 and 118, it is possible to efficiently dissipate heat generated during the operation of the first and second semiconductor chips 102 and 112. In addition, it becomes easy to secure the substrate potential at the first semiconductor chip 102 via the first outer wiring 108, and the substrate potential at the second semiconductor chip 112 via the second outer wiring 118.

In EMBODIMENT 2, the first and second outer wirings 108 and 118 are preferably coated with plating or the like.

EMBODIMENT 3

A semiconductor device and a fabrication method thereof of EMBODIMENT 3 of the present invention will be described with reference to the relevant drawings.

Figure 14:
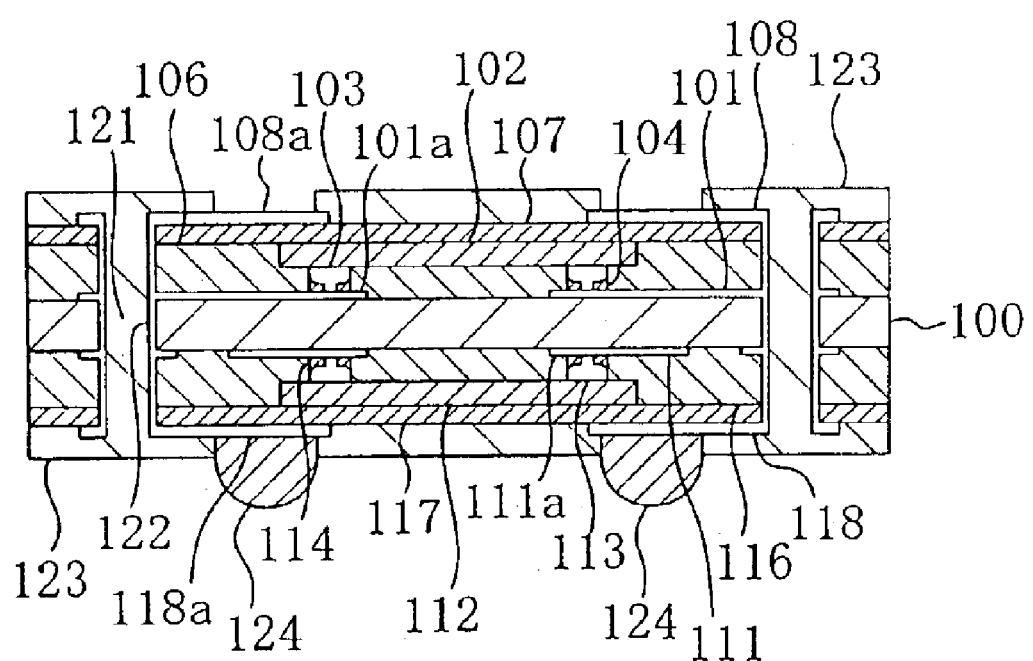
FIG. 14 is a cross-sectional view of a semiconductor device of EMBODIMENT 3 of the present invention.

FIG. 14 illustrates a cross-sectional structure of the semiconductor device of EMBODIMENT 3.

As shown in FIG. 14, EMBODIMENT 3 is different from EMBODIMENT 1 in that the outer dimensions of the first semiconductor chip 102 mounted on the top surface of the core substrate 100 are the same as the outer dimensions of the second semiconductor chip 112 mounted on the bottom surface of the core substrate 100, and that the center position of the first semiconductor chip 102 matches with the center position of the second semiconductor chip 112 when viewed through from a position above the core substrate 100.

In EMBODIMENT 3, solder material 124 is attached to the second external connection terminals 118a. The first resin layer 105 and the fourth resin layer 115 are formed as part of the second resin layer 106 and the fifth resin layer 116, respectively, and thus the first and fourth resin layers 105 and 115 are not particularly shown.

Hereinafter, the method for fabricating a semiconductor device of EMBODIMENT 3 of the present invention will be described, taking as an example fabrication of the semiconductor device of this embodiment shown in FIG. 14 with reference to the relevant drawings.

Figure 15:
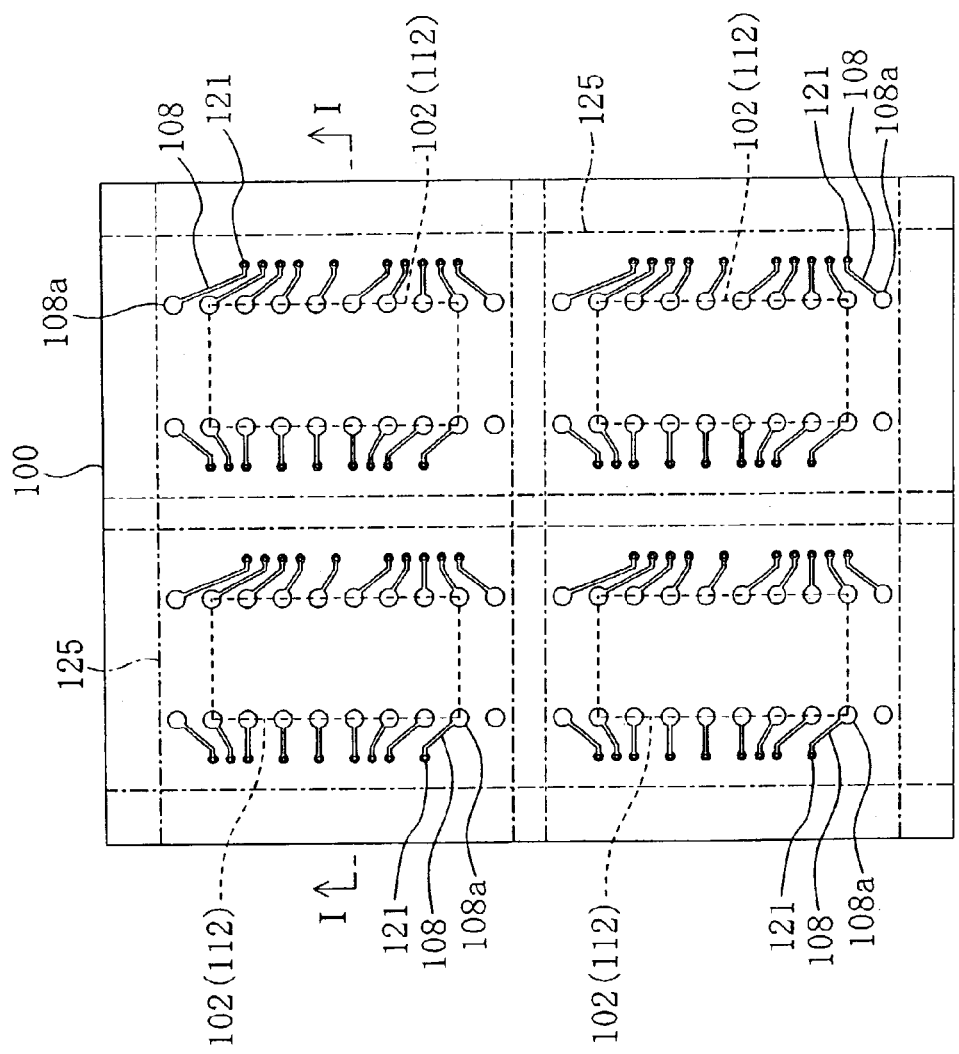
FIG. 15 is a plan view illustrating a process step of a method for fabricating the semiconductor device of EMBODIMENT 3 of the present invention.
Figure 16:
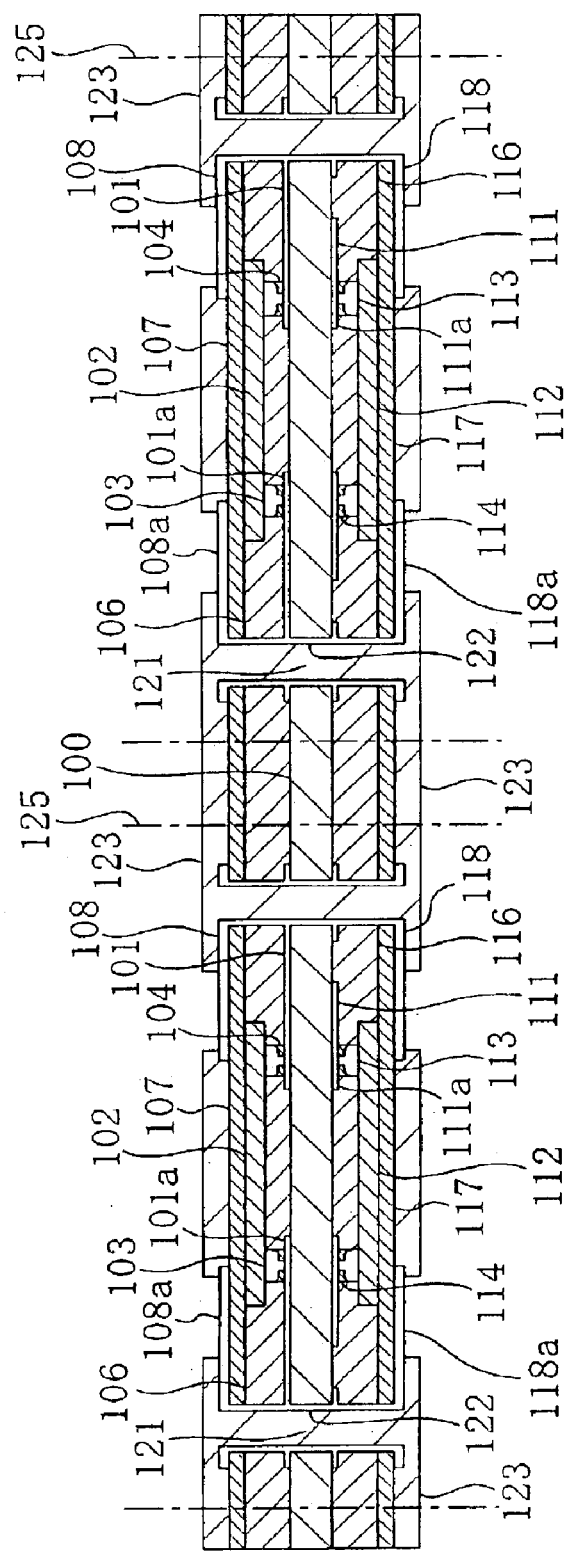
FIG. 16 is a cross-sectional view taken along line I—I of FIG. 15.
Figure 17:
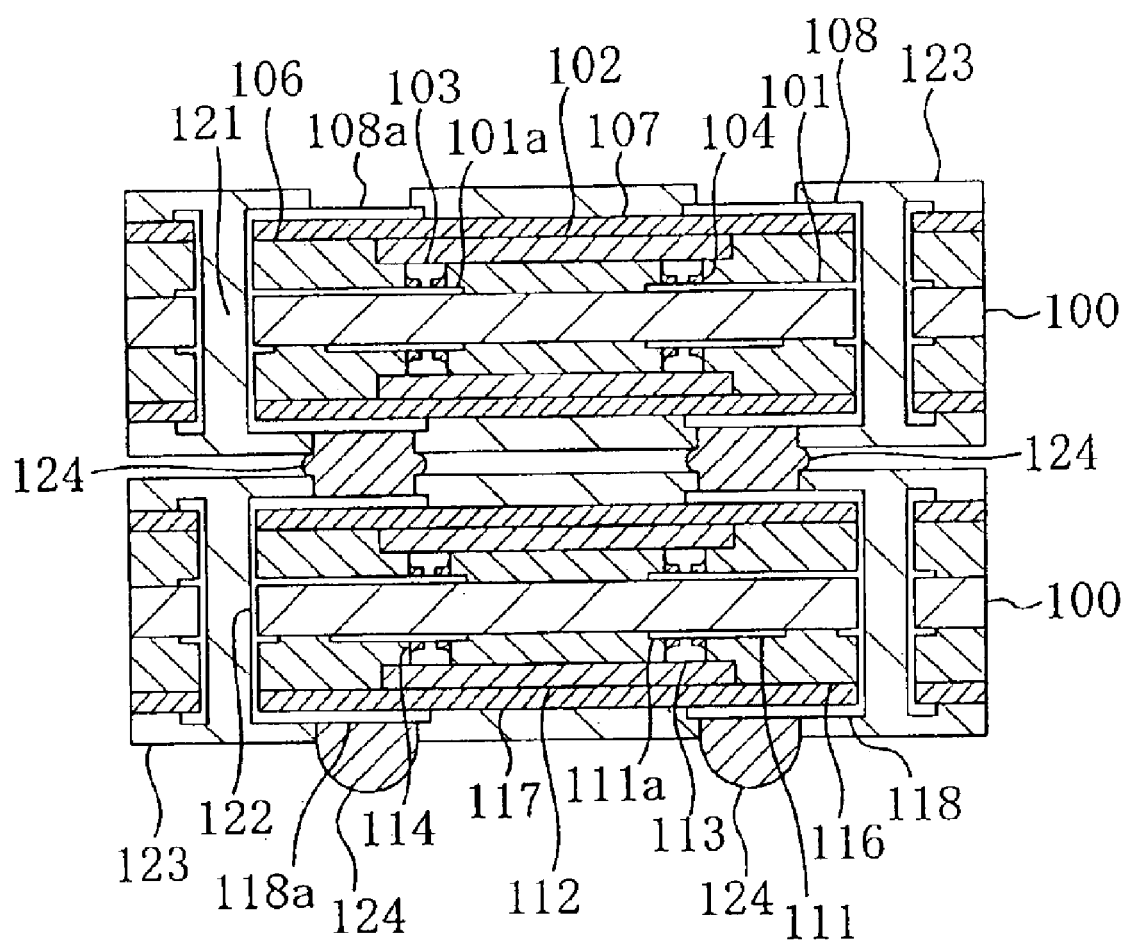
FIG. 17 is a view illustrating connection of semiconductor devices of EMBODIMENT 3 with each other.

FIG. 15 is a plan view illustrating one process step of the fabrication method of EMBODIMENT 3, and FIG. 16 is a cross-sectional view taken along line I—I of FIG. 15. FIG. 15 shows only the core substrate 100 and the first outer wiring 108 including the first external connection terminals 108a omitting the other components, while the positions of the mounted first and second semiconductor chips 102 and 112 are outlined by the dashed lines. In FIGS. 15 and 16, division lines 125 of the core substrate 100 are shown by the one-dot chain lines.

The method for fabricating a semiconductor device of EMBODIMENT 3 will be described. First, in the manner as described in EMBODIMENT 1 (see FIGS. 4A to 4C, 5A to 5C, 6A, and 6B), four first semiconductor chips 102 and four second semiconductor chips 112 are mounted on the top and bottom surfaces of the core substrate 100, respectively, so that each one is located in each of four regions, for example, into which the core substrate 100 is sectioned by the division lines 125 in a grid pattern.

To state specifically, four first inner wirings 101 and four second inner wirings 111 are formed on the top and bottom surfaces of the core substrate 100, respectively, so that each one is located in each of the four regions. The first element connection lands 101a are formed as part of the first inner wirings 101, and second element connection lands 111a are formed as part of the second inner wirings 111. The conductive paste 104 is applied to the first bumps 103 formed in advance on electrodes (not shown) provided on the circuit formation surface of each of the plural first semiconductor chips 102. The first bumps 103 are then bonded to the first element connection lands 111a. In this way, each of the first semiconductor chips 102 is formed on the top surface of the core substrate 100 for each region so that the circuit formation surface of the first semiconductor chip 102 faces the top surface of the core substrate 100. Thereafter, the top surface of the core substrate including the first semiconductor chips 102 is covered with a liquid resin. The liquid resin is then cured to form the second resin layer 106. The second resin layer 106 and the first semiconductor chips 102 are ground starting from the surfaces thereof opposite to the circuit formation surfaces of the first semiconductor chips 102, to thin the first semiconductor chips 102 and also to allow the top surfaces of the first semiconductor chips 102 to be flush with the top surface of the second resin layer 106 after the grinding. The third resin 107 is formed to cover the top surfaces of the ground first semiconductor chips 102 and the second resin layer 106, and then the first outer wiring conductive film 108A is formed on the third resin layer 107.

Subsequently, the conductive paste 114 is applied to the second bumps 113 formed in advance on electrodes (not shown) provided on the circuit formation surface of each of the plural second semiconductor chips 112. The second bumps 113 are then bonded to the second element connection lands 111a. In this way, each of the second semiconductor chips 112 is formed on the bottom surface of the core substrate 100 for each region so that the circuit formation surface of the second semiconductor chip 112 faces the bottom surface of the core substrate 100. Thereafter, the bottom surface of the core substrate 100 including the second semiconductor chips 112 is covered with a liquid resin. The liquid resin is then cured to form the fifth resin layer 116. The fifth resin layer 116 and the second semiconductor chips 112 are ground starting from the surfaces thereof opposite to the circuit formation surfaces of the second semiconductor chips 112, to thin the second semiconductor chips 112 and also to allow the bottom surfaces of the second semiconductor chips 112 to be flush with the bottom surface of the fifth resin layer 116 after the grinding. The sixth resin 117 is formed to cover the bottom surfaces of the ground second semiconductor chips 112 and the fifth resin layer 116, and then the second outer wiring conductive film 118A is formed on the sixth resin layer 117.

Subsequently, the conductive holes 121 are formed through the core substrate 100 including the resin layers, and on the wall of each of the conductive holes 121, formed is an interconnection 122 for connecting the wirings with each other. Then, the first and second outer wiring conductive films 108A and 118A are patterned to form the first and second outer wirings 108 and 118. During this formation, the first external connection terminals 108a are formed as part of the first outer wiring 108. Likewise, the second external connection terminals 118a are formed as part of the second outer wiring 118. Thereafter, the solder resist films 123 are formed to cover the top and bottom surfaces of the core substrate 100 including the resin layers and the wirings, except for the first and second external connection terminals 108a and 118a. The solder material 124 is attached to the second external connection terminals 118a. The resultant core substrate 100 is divided along the division lines 125 with a dicing saw or the like, to complete the semiconductor device of this embodiment shown in FIG. 14.

In EMBODIMENT 3, in addition to the effects obtained in EMBODIMENT 1, the following effect is obtained. It is possible to attain a small semiconductor device having plan dimensions close to those of the semiconductor chips, which is usable as a CSP. Such small semiconductor devices can be fabricated simply in large quantity.

In EMBODIMENT 3, the resin layers covering the semiconductor chips are formed symmetrically with respect to the core substrate 100. This balances the shrinkage of the resin layers on both surfaces of the core substrate 100 and thus minimizes the amount of warp of the semiconductor device.

In EMBODIMENT 3, semiconductor chips of the same type, such as semiconductor memories, are preferably used as the first and second semiconductor chips 102 and 112. By using the same type, a number of semiconductor chips can be efficiently packaged with high density. In EMBODIMENT 3, however, the types of semiconductor chips usable as the first and second semiconductor chips 102 and 112 are not specifically limited.

In EMBODIMENT 3, the solder material 124 is attached to the second external connection terminals 118a. Alternatively, the solder material 124 may be attached to the first external connection terminals 108a. Otherwise, the first or second external connection terminals 108a or 118a may be subjected to surface treatment such as metal plating or solder plating. The attachment of solder material or the surface treatment to the external connection terminals provides good wetting for solder when the semiconductor device of this embodiment is soldered to a printed board of another electric apparatus via the external connection terminals. Note that, in EMBODIMENT 3, the above effect is obtained even when the external connection terminals are not formed.

In EMBODIMENT 3, at least a pair of the first external connection terminal 108a and the second external connection terminal 118a are preferably placed to match with each other when viewed from a position above the core substrate 100. This enables use of plural semiconductor devices of this embodiment stacked on top of each other.

In EMBODIMENT 3, the attachment of the solder material 124 may be performed before or after the division of the core substrate 100. Note however that the efficiency of fabrication of the semiconductor device is higher when it is performed before the division of the core substrate 100.

In EMBODIMENT 3, the core substrate 100 was divided into four regions with the division lines 125. The number of regions is not specifically limited. Note however that the greater the number of regions, that is, the number of semiconductor devices formed by dividing the core substrate 100 is, the more efficient the fabrication of the semiconductor devices is.

In EMBODIMENT 3, the third resin layer 107 and the sixth resin layer 117 may be omitted as in EMBODIMENT 2.

(Modification of EMBODIMENT 3)

A modification of the semiconductor device and the fabrication method thereof of EMBODIMENT 3 of the present invention will be described with reference to the relevant drawings.

This modification is different from EMBODIMENT 3 described above in that the outer dimensions of the first semiconductor chip 102 mounted on the top surface of the core substrate 100 is different from the outer dimensions of the second semiconductor chip 112 mounted on the bottom surface of the core substrate 100, and that the center position of the first semiconductor chip 102 does not match with the center position of the second semiconductor chip 112 when viewed from a position above the core substrate 100.

Hereinafter, the method for fabricating the semiconductor device of the modification of EMBODIMENT 3 will be described with reference to the relevant drawings.

Figure 18:
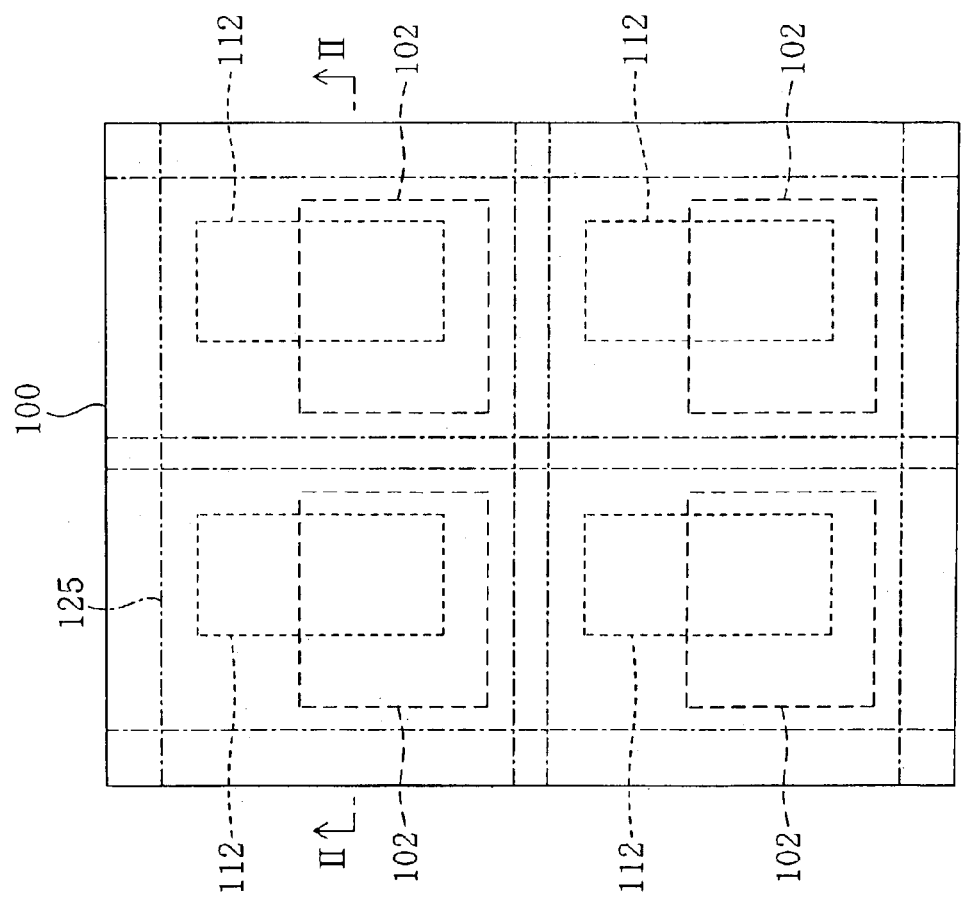
FIG. 18 is a plan view illustrating a process step of a modification of the method for fabricating the semiconductor device of EMBODIMENT 3 of the present invention.
Figure 19:
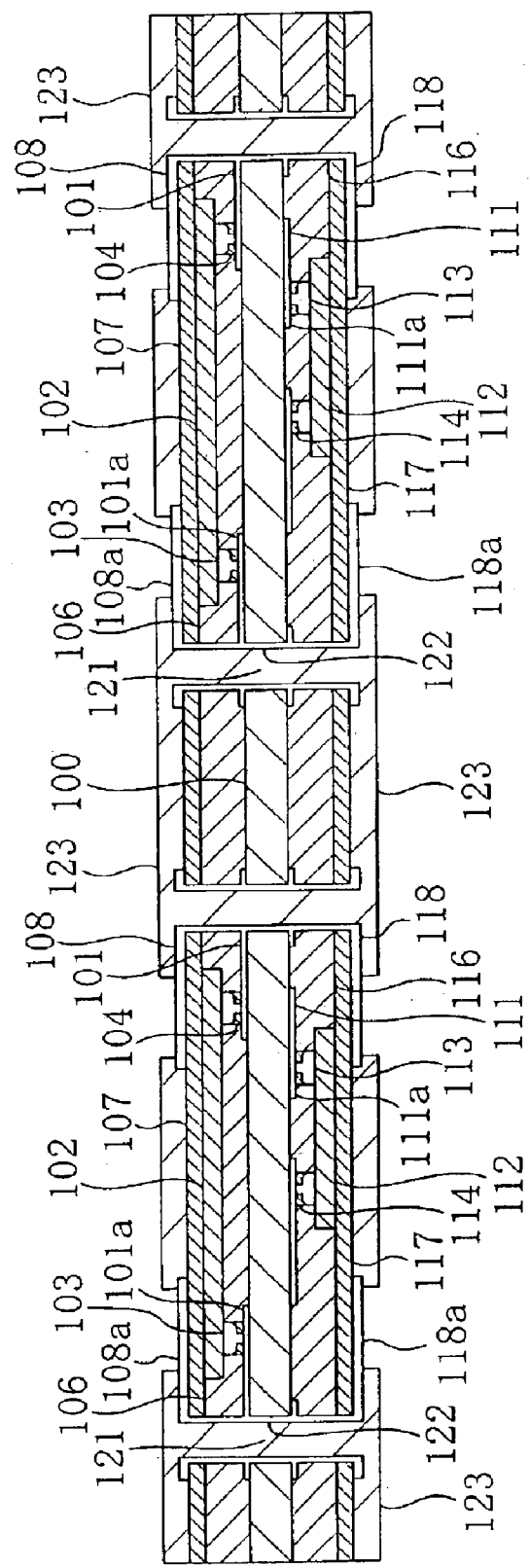
FIG. 19 is a cross-sectional view taken along line II—II of FIG. 18.

FIG. 18 is a plan view illustrating one process step of the modification of the fabrication method of the EMBODIMENT 3, and FIG. 19 is a cross-sectional view taken along line II—II of FIG. 18. FIG. 18 shows only the core substrate 100 omitting the other components, while the positions of the first semiconductor chip 102 and the second semiconductor chip 112 mounted are outlined by the longer dashed lines and the shorter dashed lines. In FIGS. 18 and 19, the division lines 125 of the core substrate 100 are shown by the one-dot chain lines.

The method for fabricating the semiconductor device of the modification of EMBODIMENT 3 is as follows. First, in the manner as described in EMBODIMENT 1 (see FIGS. 4A to 4C, 5A to 5C, 6A, and 6B), four first semiconductor chips 102 and four second semiconductor chips 112 are mounted on the top and bottom of the core substrate 100, respectively, so that each one is located in each of four regions, for example, into which the core substrate 100 is sectioned by the division lines 125 in a grid pattern as shown in FIGS. 18 and 19. The outer dimensions of the first semiconductor chips 102 are different from the outer dimensions of the second semiconductor chips 112, and the center position of the first semiconductor chip 102 does not match with the center position of the second semiconductor chip 112 in each region when viewed from a position above the core substrate 100. Thereafter, although illustration is omitted, the core substrate 100 is divided along the division lines 125 with a dicing saw or the like, to complete the semiconductor device of this modification.

Thus, in the modification of EMBODIMENT 3, the outer dimensions of the first semiconductor chip 102 are different from the outer dimensions of the second semiconductor chip 112, or the center position of the first semiconductor chip 102 does not match with the center position of the second semiconductor chip 112 when viewed from a position above the core substrate 100. Nevertheless, the effects of EMBODIMENT 3 described above are essentially obtained as long as the first and second semiconductor chips 102 and 112 are mounted on the top and bottom surfaces of the core substrate 100 for each of the regions into which the core substrate 100 is sectioned by the division lines 125.

EMBODIMENT 4

A semiconductor device and a fabrication method thereof of EMBODIMENT 4 of the present invention will be described with reference to the relevant drawings.

Figure 20:
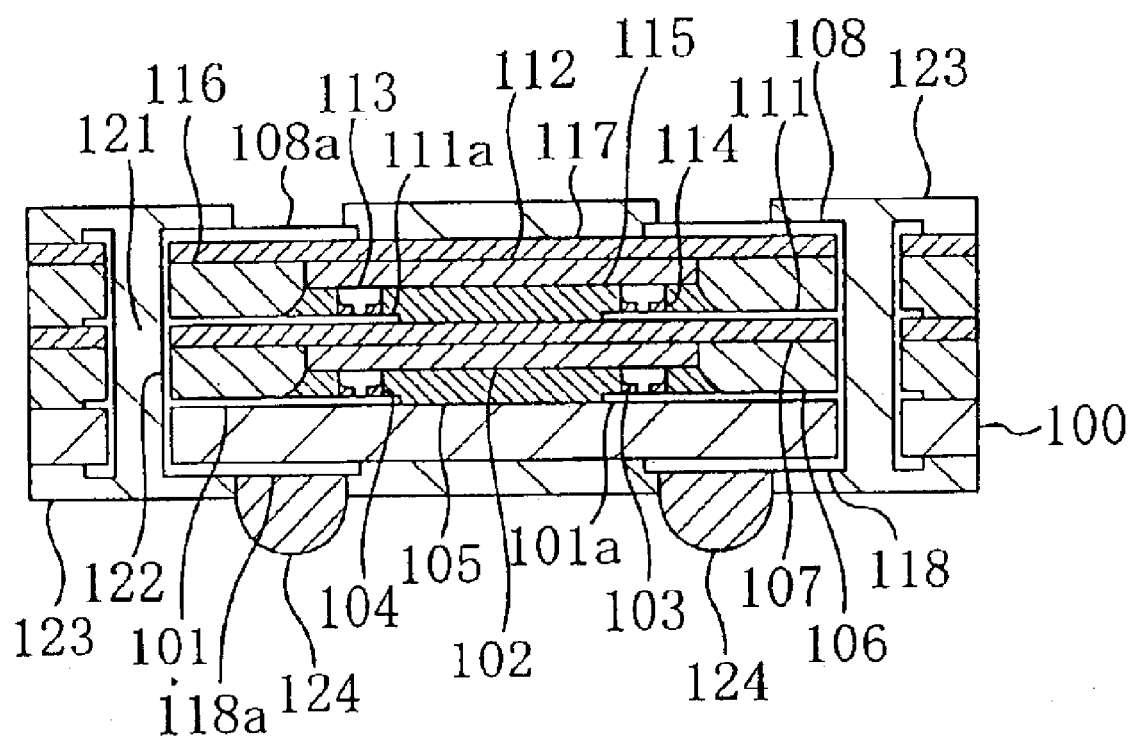
FIG. 20 is a cross-sectional view of a semiconductor device of EMBODIMENT 4 of the present invention.

FIG. 20 illustrates a cross-sectional structure of the semiconductor device of EMBODIMENT 4.

As shown in FIG. 20, EMBODIMENT 4 is greatly different from EMBODIMENT 1 in that the second semiconductor chip 112 is mounted on the top surface of the, first semiconductor chip 102, which is mounted on the top surface of the core substrate 100, so that the circuit formation surface of the second semiconductor chip 112 faces the top surface of the core substrate 100. Note that in EMBODIMENT 4, as in EMBODIMENT 3, the outer dimensions of the first semiconductor chip 102 are the same as the outer dimensions of the second semiconductor chip 112, and that the center position of the first semiconductor chip 102 matches with the center position of the second semiconductor chip 112 when viewed from a position above the core substrate 100.

To state specifically, as shown in FIG. 20, the first inner wiring 101 is formed on the top surface of the core substrate 100. On the top surface of the core substrate 100, also, mounted is the first semiconductor chip 102 so that the circuit formation surface thereof faces the top surface of the core substrate 100. In more detail, the first bumps 103, which are formed on electrodes (not shown) provided on the circuit formation surface of the first semiconductor chip 102, are bonded to the first element connection lands 101a of the first inner wiring 101 with the conductive paste 104. That is, the first semiconductor chip 102 and the first inner wiring 101 are electrically connected with each other. The first resin layer 105 is formed between the first semiconductor chip 102 and the core substrate 100, and the second resin layer 106 is formed to cover the top surface of the core substrate 100 and the sides of the first semiconductor chip 102. The top surface of the first semiconductor chip 102 is made flush with the top surface of the second resin layer 106. The third resin layer 107 is formed to cover the top surfaces of the first semiconductor chip 102 and the second resin layer 106.

The second inner wiring 111 is formed on the top surface of the third resin layer 107. On the top surface of the third resin layer 107, also, mounted is the second semiconductor chip 112 so that the circuit formation surface thereof faces the top surface of the core substrate 100. In more detail, the second bumps 113, which are formed on electrodes (not shown) provided on the circuit formation surface of the second semiconductor chip 112, are bonded to the second element connection lands 101a of the second inner wiring 111 with the conductive paste 114. That is, the second semiconductor chip 112 and the second inner wiring 111 are electrically connected with each other. The fourth resin layer 115 is formed between the second semiconductor chip 112 and the third resin layer 107, and the fifth resin layer 116 is formed to cover the top surface of the third resin layer 107 and the sides of the second semiconductor chip 112. The top surface of the second semiconductor chip 112 is made flush with the top surface of the fifth resin layer 116. The sixth resin layer 117 is formed to cover the top surfaces of the second semiconductor chip 112 and the fifth resin layer 116. The first outer wiring 108 is formed on the top surface of the sixth resin layer 117. The second outer wiring 118 is formed on the bottom surface of the core substrate 100.

The conductive holes 121 are formed through the core substrate 100 including the resin layers, and on the wall of each of the conductive holes 121, formed is the interconnection 122 for connecting the wirings with each other. The solder resist films 123 cover the top and bottom surfaces of the core substrate 100 including the resin layers and the wirings, except for the first and second external connection terminals 108a and 118a provided as part of the first and second outer wirings 108 and 118. The solder material 124 is attached to the second external connection terminals 118a.

The feature of the semiconductor device of EMBODIMENT 4 is that the first and second semiconductor chips 102 and 112 are stacked on top of each other on the top surface of the core substrate 100 with the respective circuit formation surfaces facing in the same direction. Hereinafter, an advantage of EMBODIMENT 4 over EMBODIMENT 3 as a comparative example benefited from this feature will be described with reference to the relevant drawings, for the case that the first and second semiconductor chips 102 and 112 are semiconductor memories of the same type. In this case, however, it should be noted that the electrical connection between the first and second semiconductor chips 102 and 112 must be such that the same address terminals, the same I/O terminals, the same control terminals, and the like of these semiconductor chips are connected with each other.

Figure 22A:
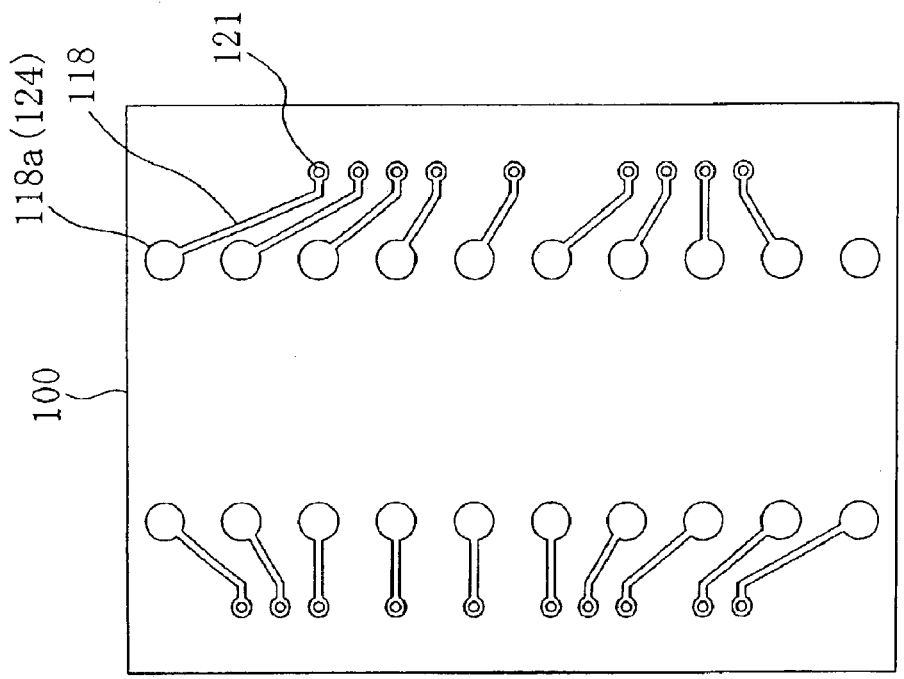
FIGS. 22A and 22B are views schematically illustrating other wiring patterns of the comparative example.
Figure 22B:
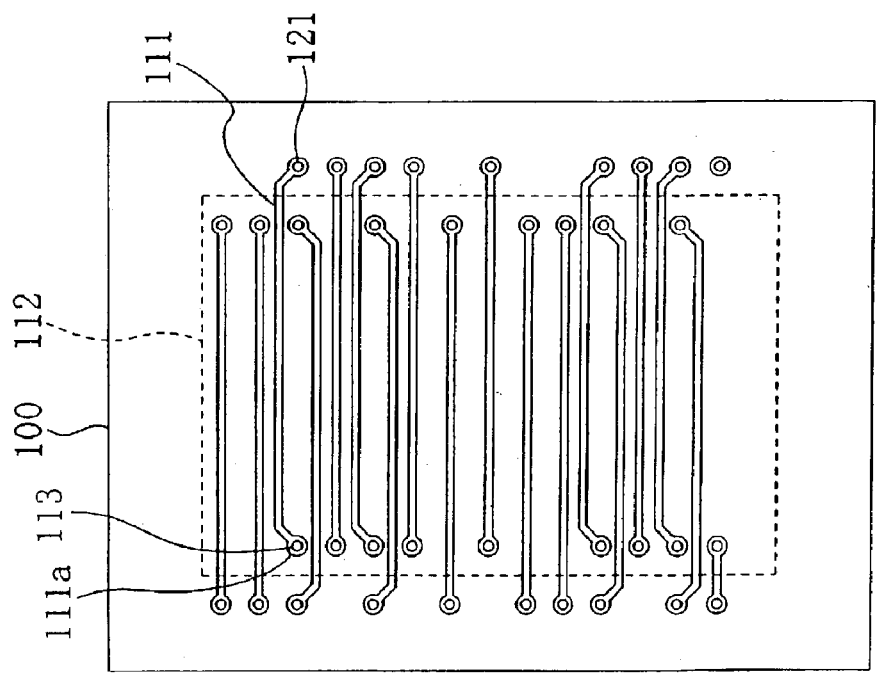

FIGS. 21A, 21B, 22A, and 22B schematically illustrate patterns of the wirings of the semiconductor device of EMBODIMENT 3 (see FIG. 14) as the comparative example. Specifically, FIG. 21A illustrates a pattern of the first outer wiring 108 including the first external connection terminals 108a, FIG. 21B illustrates a pattern of the first inner wiring 101 including the first element connection lands 101a, FIG. 22A illustrates a pattern of the second inner wiring 111 including the second element connection lands 111a, and FIG. 22B illustrates a pattern of the second outer wiring 118 including the second external connection terminals 118a.

Figure 24A:
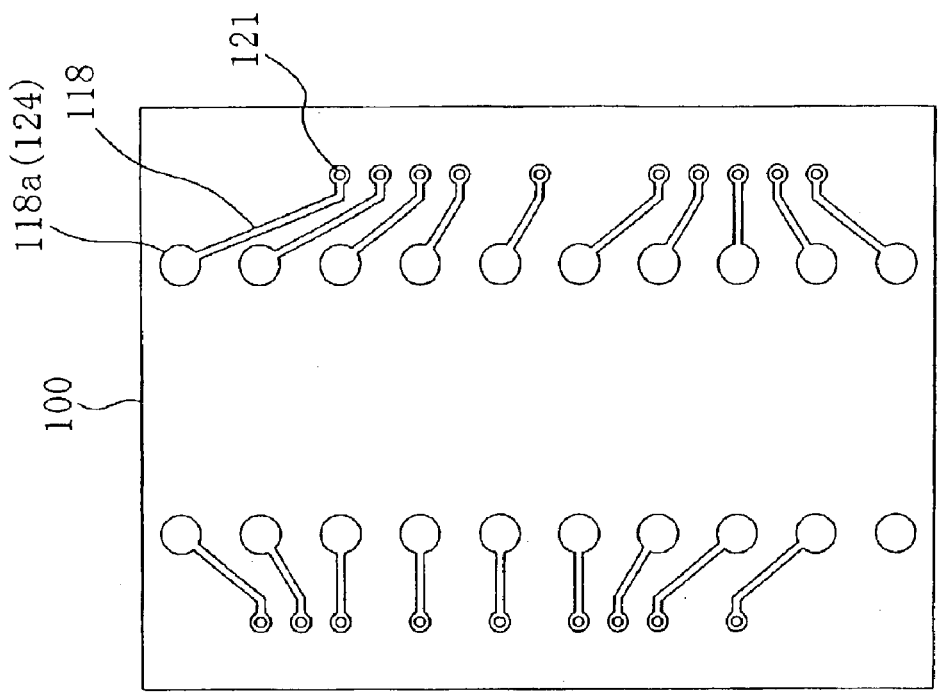
FIGS. 24A and 24B are views schematically illustrating other wiring patterns of the semiconductor device of EMBODIMENT 4.
Figure 24B:
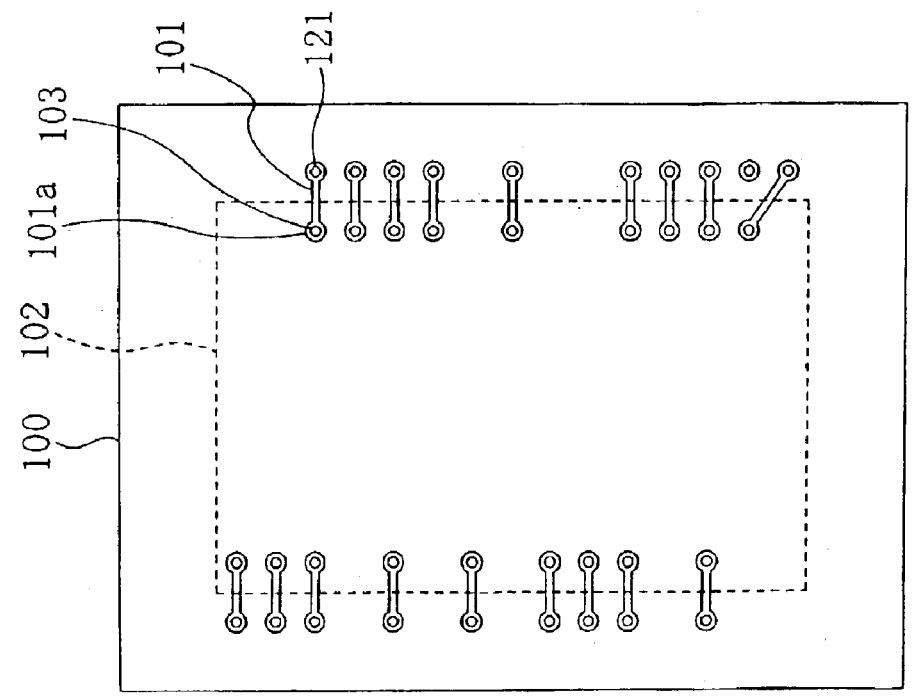

FIGS. 23A, 23B, 24A, and 24B schematically illustrate patterns of the wirings of the semiconductor device of EMBODIMENT 4 (see FIG. 20). Specifically, FIG. 23A illustrates a pattern of the first outer wiring 108 including the first external connection terminals 108a, FIG. 23B illustrates a pattern of the first inner wiring 101 including the first element connection lands 101a, FIG. 24A illustrates a pattern of the second inner wiring 111 including the second element connection lands 111a, and FIG. 24B illustrates a pattern of the second outer wiring 118 including the second external connection terminals 118a.

In FIGS. 21A, 21B, 22A and 22B, and FIGS. 23A, 23B, 24A and 24B, the outline of the core substrate 100 and the positions of the conductive holes 121 are shown in addition to the respective wiring patterns. Also shown as required are the positions of the first bumps 103 and the second bumps 113 and the positions of mounting of the first semiconductor chip 102 and the second semiconductor chip 112.

As shown in FIGS. 21A, 21B, 22A, and 22B, in the comparative example, the circuit formation surface of the first semiconductor chip 102 mounted on the top surface of the core substrate 100 and the circuit formation surface of the second semiconductor chip 112 mounted on the bottom surface of the core substrate 100 face in the opposite directions. Therefore, the first and second semiconductor chips 102 and 112 fail to be located so that the same address terminals thereof overlap with each other when viewed from a position above the core substrate 100. In this construction, if it is attempted to connect the same address terminals of the first and second semiconductor chips 102 and 112 with each other via the conductive holes 121, long paths are required for the second inner wiring 111 as shown in FIG. 22A, for example.

On the contrary, as shown in FIGS. 23A, 23B, 24A, and 24B, in EMBODIMENT 4, the circuit formation surface of the first semiconductor chip 102 mounted on the top surface of the core substrate 100 and the circuit formation surface of the second semiconductor chip 112 mounted on the top surface of the first semiconductor chip 102 on the core substrate 100 face in the same direction. It is therefore possible to stack the first and second semiconductor chips 102 and 112 so that the same address terminals overlap with each other when viewed from a position above the core substrate 100. Thus, the same address terminals of the first and second semiconductor chips 102 and 112 can be connected with each other via the conductive holes 121 requiring only short wiring paths (see FIGS. 23B and 24A). In other words, in EMBODIMENT 4, wiring run is simple compared with the comparative example and thus formation of wiring is easy.

Hereinafter, the method for fabricating a semiconductor device of EMBODIMENT 4 will be described, taking as an example fabrication of the semiconductor device of this embodiment shown in FIG. 20 with reference to the relevant drawings.

Figure 25:
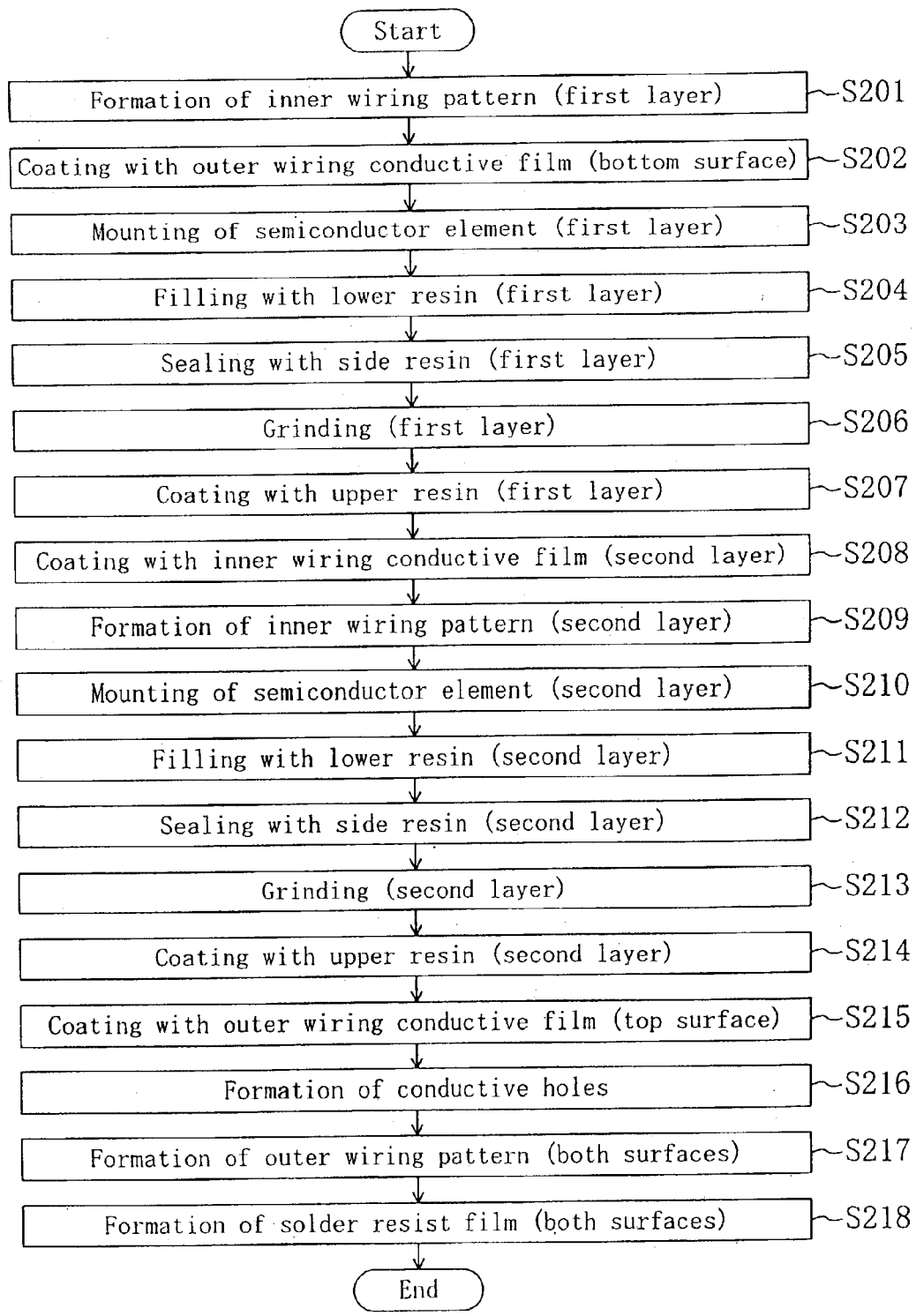
FIG. 25 is a flowchart of a method for fabricating the semiconductor device of EMBODIMENT 4 of the present invention.

FIG. 25 is a flowchart of the fabrication method of EMBODIMENT 4. FIGS. 26A through 26C, 27A through 27C, 28A, and 28B are cross-sectional views illustrating the respective process steps of the fabrication method of EMBODIMENT 4.

Figure 26A:
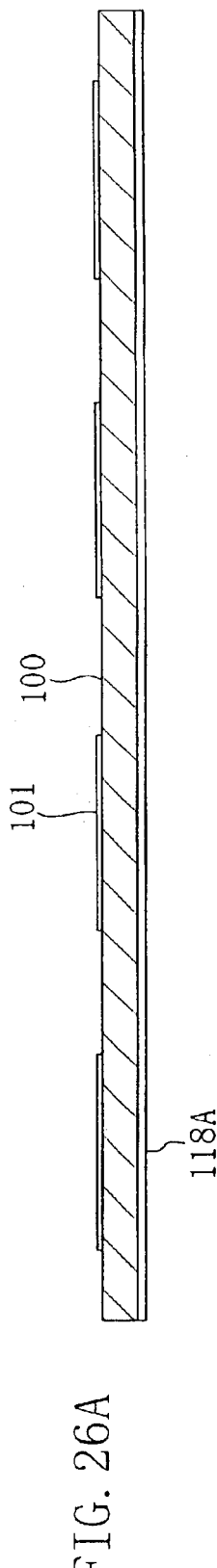
FIGS. 26A through 26C are cross-sectional views illustrating process steps of the method for fabricating the semiconductor device of EMBODIMENT 4.

First, referring to FIG. 26A, in step S201, a plurality of first inner wirings 101 are formed on the top surface of the core substrate 100 so that each one is located in each of a plurality of regions into which the core substrate 100 is sectioned by division lines (not shown) in a grid pattern. During this formation, the first element connection lands 111a are formed as part of the first inner wiring 101. In step S202, the second outer wiring conductive film 118A is formed on the bottom surface of the core substrate 100.

Figure 26B:
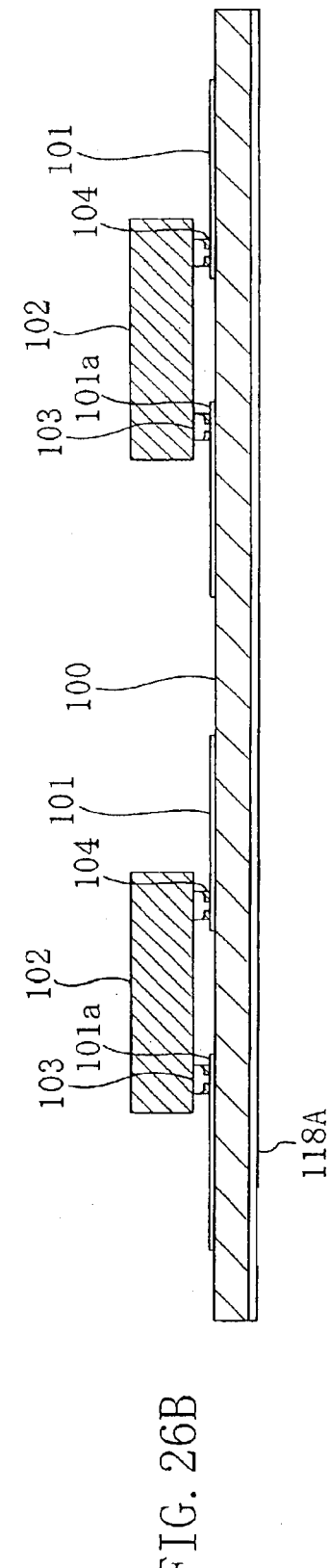

Referring to FIG. 26B, in step S203, the conductive paste 104 is applied to the first bumps 103 that have been formed in advance on electrodes (not shown) provided on the circuit formation surface of the first semiconductor chip 102. The first bumps 103 are then bonded to the first element connection lands 111a. In this way, each of the first semiconductor chips 102 is formed on the top surface of the core substrate 100 for each region so that the circuit formation surface of the first semiconductor chip 102 faces the top surface of the core substrate 100.

Figure 26C:
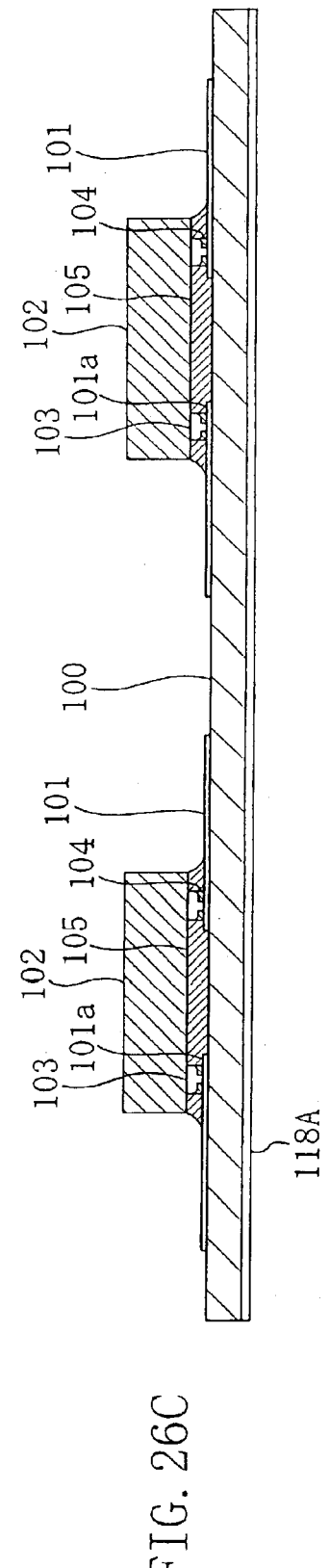

Referring to FIG. 26C, in step S204, a liquid resin is filled into the spaces between each of the first semiconductor chips 102 and the core substrate 100 and then cured, to form the first resin layer 105 (lower resin).

Figure 27A:
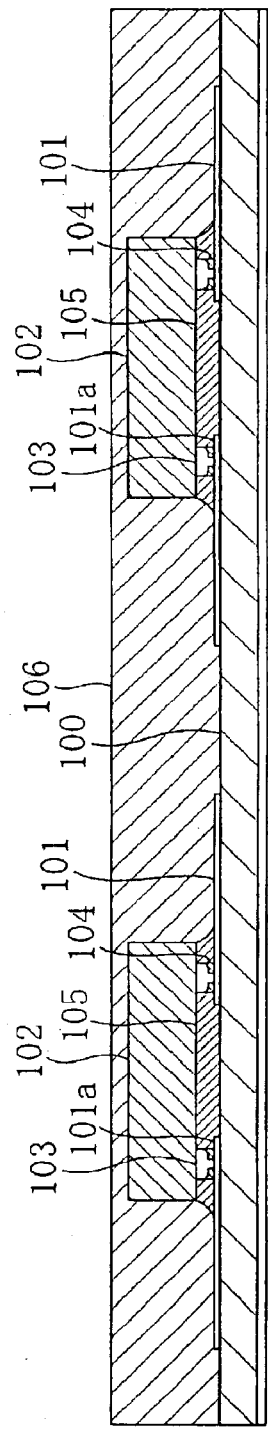
FIGS. 27A through 27C are cross-sectional views illustrating subsequent process steps of the method for fabricating the semiconductor device of EMBODIMENT 4.

Referring to FIG. 27A, in step S205, a liquid resin is formed to cover the top surface of the core substrate 100 including the first semiconductor chips 102 and then cured, to form the second resin layer 106 (side resin).

Figure 27B:
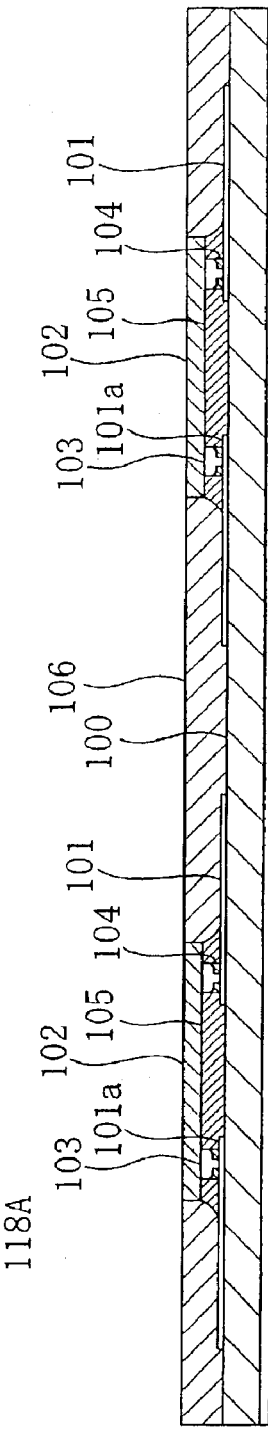

Referring to FIG. 27B, in step S206, the second resin layer 106 and the first semiconductor chips 102 are ground starting from the surfaces opposite to the circuit formation surfaces of the first semiconductor chips 102, to thin the first semiconductor chips 102 and also to allow the top surfaces of the first semiconductor chips 102 to be flush with the top surface of the second resin layer 106 after the grinding.

Figure 27C:
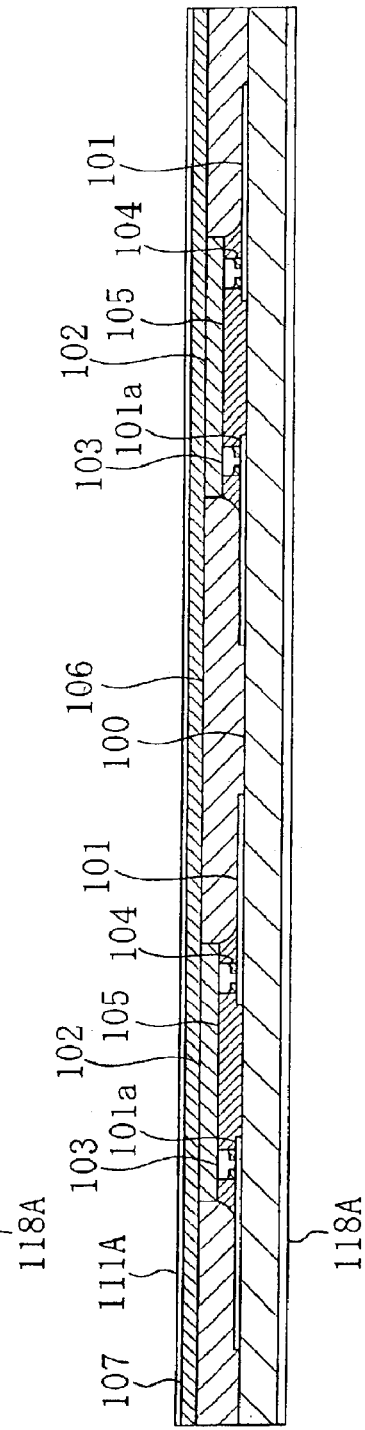

Referring to FIG. 27C, in step S207, the third resin layer 107 (upper resin) is formed to cover the top surfaces of the first semiconductor chips 102 and the top surface of the second resin layer 106 after the grinding. In step S208, the second inner wiring conductive film 111A that is to be patterned into the second inner wiring 111 is formed on the third resin layer 107.

Figure 28A:
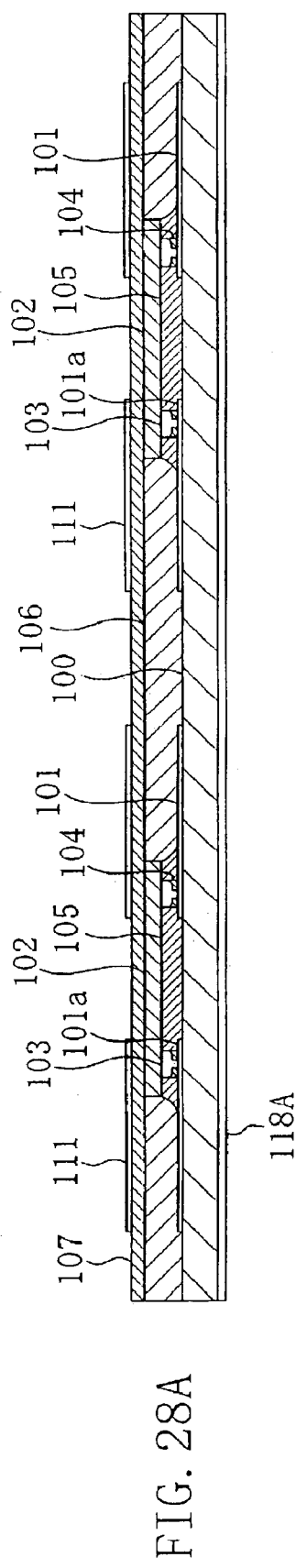
FIGS. 28A and 28B are cross-sectional views illustrating subsequent process steps of the method for fabricating the semiconductor device of EMBODIMENT 4.

Referring to FIG. 28A, in step S209, the second inner wiring conductive film 111A is patterned to form a plurality of second inner wirings 111 on the top surface of the third resin layer 107 so that each one is located in each of the regions. During this formation, the second element connection lands 111a are formed as part of the second inner wiring 111.

Figure 28B:
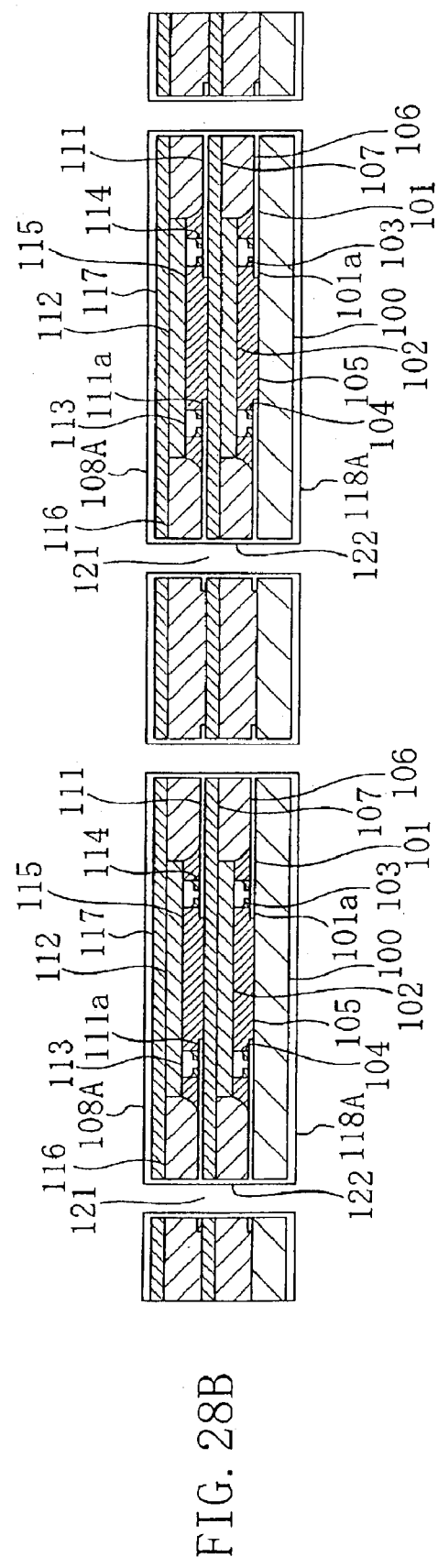
Figure 30A:
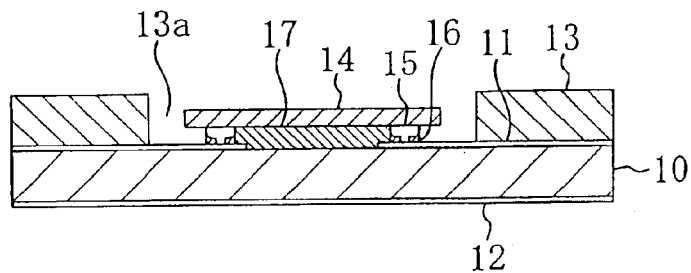
FIGS. 30A through 30C are cross-sectional views illustrating the process steps of a conventional method for fabricating a semiconductor device.
Figure 30B:
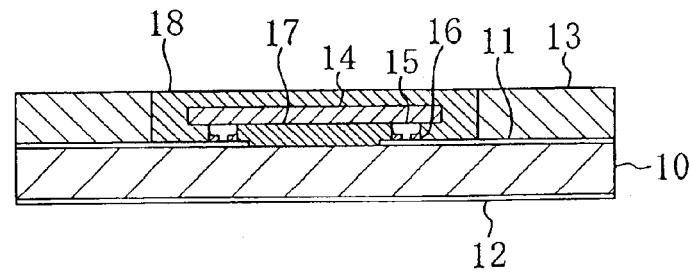
Figure 30C:
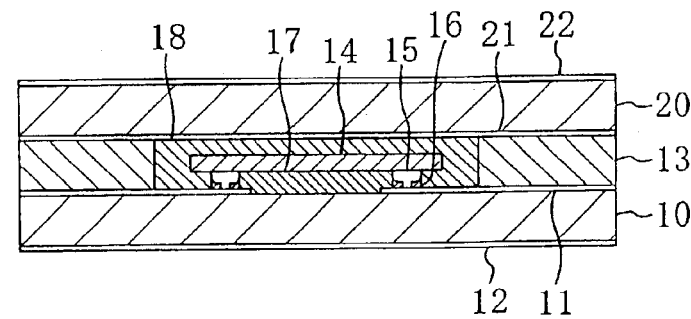

Thereafter, referring to FIG. 28B, process steps similar to steps S203 through S207 are performed. That is, in step S210, the conductive paste 114 is applied to the second bumps 113 that have been formed in advance on electrodes (not shown) provided on the circuit formation surface of each of the second semiconductor chips 112. The second bumps 113 are then bonded to the second element connection lands 111a. In this way, the second semiconductor chip 112 is mounted on the top surface of the third resin layer 107 for each region so that the circuit formation surface of the second semiconductor chip 112 faces the top surface of the core substrate 100. Note that the outer dimensions of the second semiconductor chip 112 are the same as the outer dimensions of the first semiconductor chip 102, and the center position of the second semiconductor chip 112 matches with the center position of the first semiconductor chip 102 for each region when viewed from a position above the core substrate 100. In step S211, a liquid resin is filled into the space between each of the second semiconductor chips 112 and the core substrate 100 and then cured, to form the fourth resin layer 115 (lower resin). In step S212, a liquid resin is formed to cover the top surface of the third resin layer 107 including the second semiconductor chips 112 and then cured, to form the fifth resin layer 116 (side resin). In step S213, the fifth resin layer 116 and the second semiconductor chips 112 are ground starting from the surfaces opposite to the circuit formation surfaces of the second semiconductor chips 112, to thin the second semiconductor chips 112 and also to allow the top surfaces of the second semiconductor chips 112 to be flush with the top surface of the fifth resin layer 116 after the grinding. In step S214, the sixth resin layer 117 (upper resin) is formed to cover the top surfaces of the second semiconductor chips 112 and the top surface of the fifth resin layer 116 after the grinding. In step S215, the first outer wiring conductive film 108A is formed on the sixth resin layer 117. Thereafter, in step S216, the conductive holes 121 are formed through the core substrate 100 including the resin layers, and the interconnection 122 is formed on the wall of each of the conductive holes 121 for connecting the wirings with each other.

Referring to FIG. 29A, in step S217, the first and second outer wiring conductive films 108A and 118A are patterned to form a plurality of first outer wirings 108 and a plurality of second outer wirings 118 each for each region. During this formation, the first external connection terminals 108a are formed as part of the first outer wiring 108. Likewise, the second external connection terminals 118a are formed as part of the second outer wiring 118.

Referring to FIG. 29B, the solder resist films 123 are formed to cover the top and bottom surfaces of the core substrate 100 including the resin layers and the wirings, except for the first and second external connection terminals 108a and 118a. Thereafter, although illustration is omitted, the solder material 124 is attached to each of the second external connection terminals 118a, and then the core substrate 100 is divided along the division lines 125 with a dicing saw or the like, to complete the semiconductor device of this embodiment.

In EMBODIMENT 4, in addition to the effects obtained in EMBODIMENT 1 and the effects obtained in EMBODIMENT 3 (excluding that induced from the symmetrical formation of the resin layers covering the semiconductor chips with respect to the core substrate 100), the following effect is obtained. That is, if the first and second semiconductor chips 102 and 112 are of the same type, it is possible to minimize the length of the wiring connecting these semiconductor chips, and thus simplify the wiring pattern.

In EMBODIMENT 4, the outer dimensions of the first semiconductor chip 102 is the same as the outer dimensions of the second semiconductor chip 112, and the center position of the first semiconductor chip 102 matches with the center position of the second semiconductor chip 112 when viewed from a position above the core substrate 100. The effects of this embodiment are also essentially obtained when the outer dimensions of the first and second semiconductor chips 102 and 112 are different from each other, or the center positions of the first and second semiconductor chips 102 and 112 do not match with each other when viewed from a position above the core substrate 100, as long as the first and second semiconductor chips 102 and 112 are layered on the top surface of the core substrate 100 for each of the regions into which the core substrate 100 is sectioned by the division lines.

In EMBODIMENT 4, semiconductor memories of the same type were used as the first and second semiconductor chips 102 and 112. Instead, semiconductor chips having the same number of terminals at the same positions may be used.

In EMBODIMENT 4, the third resin layer 107 and the sixth resin layer 117 may be omitted as in EMBODIMENT 2.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention that fall within the true spirit and scope of the invention.

What is claimed is:

1. A method for fabricating a semiconductor device comprising the steps of:
   (1) mounting a first semiconductor chip on a first surface of a substrate, the substrate having first wiring formed on the first surface and second wiring formed on a second surface, so that a first circuit formation surface of the first semiconductor chip faces the first surface of the substrate and that a first electrode provided on the first circuit formation surface is connected with the first wiring;
   (2) forming a first sealing resin layer on the first surface of the substrate to cover the first semiconductor chip;
   (3) grinding the first sealing resin layer and the first semiconductor chip starting from a surface opposite to the first circuit formation surface to thin the first semiconductor chip;
   (4) mounting a second semiconductor chip on the second surface of the substrate so that a second circuit formation surface of the second semiconductor chip faces the second surface of the substrate and that a second electrode provided on the second circuit formation surface is connected with the second wiring;
   (5) forming a second sealing resin layer on the second surface of the substrate to cover the second semiconductor chip; and
   (6) grinding the second sealing resin layer and the second semiconductor chip starting from a surface opposite to the second circuit formation surface to thin the second semiconductor chip,
   wherein the step (3) is performed in the state where the second wiring has not been formed on the second surface of the substrate.

2. A method for fabricating a semiconductor device comprising the steps of:
   (1) mounting a first semiconductor chip on a first surface of a substrate, the substrate having first wiring formed on the first surface and second wiring formed on a second surface, so that a first circuit formation surface of the first semiconductor chip faces the first surface of the substrate and that a first electrode provided on the first circuit formation surface is connected with the first wiring;

(2) forming a first sealing resin layer on the first surface of the substrate to cover the first semiconductor chip;

(3) grinding the first sealing resin layer and the first semiconductor chip starting from a surface opposite to the first circuit formation surface to thin the first semiconductor chip;

(4) mounting a second semiconductor chip on the second surface of the substrate so that a second circuit formation surface of the second semiconductor chip faces the second surface of the substrate and that a second electrode provided on the second circuit formation surface is connected with the second wiring;

(5) forming a second sealing resin layer on the second surface of the substrate to cover the second semiconductor chip; and (6) grinding the second sealing resin layer and the second semiconductor chip starting from a surface opposite to the second circuit formation surface to thin the second semiconductor chip, wherein the step (3) is performed in the state where a conductive film is formed on the second surface of the substrate and has not yet been patterned into the second wiring.

* * * * *